United States Patent
Chiang et al.

(10) Patent No.: US 11,171,560 B2
(45) Date of Patent: Nov. 9, 2021

(54) SWITCHING REGULATOR HAVING LOW START-UP VOLTAGE AND SWITCH CONTROL CIRCUIT THEREOF

(71) Applicant: RICHTEK TECHNOLOGY CORPORATION, Zhubei (TW)

(72) Inventors: Po-Yu Chiang, Yilan (TW); Hung-Yu Cheng, Taipei (TW)

(73) Assignee: RICHTEK TECHNOLOGY CORPORATION, Zhubei (TW)

(*) Notice: Subject to any disclaimer, the term of this patent is extended or adjusted under 35 U.S.C. 154(b) by 159 days.

(21) Appl. No.: 16/779,764

(22) Filed: Feb. 3, 2020

(65) Prior Publication Data
US 2020/0304018 A1    Sep. 24, 2020

(30) Foreign Application Priority Data

Mar. 22, 2019   (CN) .......................... 201910223056.6

(51) Int. Cl.
*H02M 1/36*    (2007.01)
*H02M 3/07*    (2006.01)
*H02M 1/08*    (2006.01)
*H01L 27/092*  (2006.01)
*H03K 3/03*    (2006.01)

(52) U.S. Cl.
CPC ............... *H02M 1/36* (2013.01); *H02M 1/08* (2013.01); *H02M 3/07* (2013.01); *H01L 27/092* (2013.01); *H03K 3/0315* (2013.01)

(58) Field of Classification Search
CPC ........ H02M 1/36; H02M 1/08; H02M 1/0006; H02M 3/07; H01L 27/092; H01L 21/823814; H03K 3/0315
See application file for complete search history.

(56) References Cited

U.S. PATENT DOCUMENTS

2012/0126768 A1* 5/2012 Ishino .................. H02M 3/156
                                                323/283

* cited by examiner

*Primary Examiner* — Sibin Chen
(74) *Attorney, Agent, or Firm* — Tung & Associates

(57) ABSTRACT

A switching regulator having a low start-up voltage includes a power stage and a switch control circuit. The switch control circuit includes a power control switch. The power control switch is formed by a low threshold voltage transistor having a first conductivity type in a semiconductor substrate. The low threshold voltage transistor having the first conductivity type includes a first lightly doped region having a second conductivity type which forms a channel region of the low threshold voltage transistor having the first conductivity type. The semiconductor substrate includes a second lightly doped region having the second conductivity type which is formed by a same manufacturing process as the first lightly doped region having the second conductivity type. The second lightly doped region having the second conductivity type forms a drift region of a high-voltage transistor having the second conductivity type in the semiconductor substrate.

31 Claims, 19 Drawing Sheets

SWITCHING REGULATOR HAVING LOW START-UP VOLTAGE AND SWITCH CONTROL CIRCUIT THEREOF

CROSS REFERENCE

The present invention claims priority to CN 201910223056.6, filed on Mar. 22, 2019.

BACKGROUND OF THE INVENTION

Field of Invention

The present invention relates to a switching regulator; particularly, it relates to a switching regulator having low start-up voltage. The present invention also relates to a switch control circuit for use in the switching regulator having low start-up voltage.

Description of Related Art

Please refer to FIG. 1, which shows a schematic diagram of a prior art switching regulator 1. In the prior art shown in FIG. 1, for the switching regulator 1 to be able to start up at a low input voltage Vin, a transistor FET1 having an adjustable threshold voltage is adopted as a power switch of the switching regulator 1, wherein when the input voltage Vin is low, a body electrode of the transistor FET1 can be biased to a level higher than ground voltage level, so that the threshold voltage of the transistor FET1 becomes lower, whereby the switching regulator 1 can start up at a lower input voltage Vin.

The prior art in FIG. 1 has a drawback that: it is required to switch the bias voltage of the body electrode of the power switch (i.e., the transistor FET1).

Please refer to FIG. 2, which shows a schematic diagram of another prior art switching regulator. When an input voltage Vin is low, the controller 1000 pumps the input voltage Vin to a higher voltage level by a charge pump 105 and related circuits, so as to generate a control signal CTRL having a high voltage level to control a power switch 11, to start up the switching regulator of FIG. 2 at a low input voltage Vin.

The prior art in FIG. 2 has a drawback that: it is required for the oscillator 102, the single steady-state circuit 103, the phase generator 104, the charge pump 105, the switch 100 and the switch 101 to adopt low threshold voltage transistors. Usually, it takes extra manufacturing steps and masks to manufacture a low threshold voltage transistor, thus causing higher manufacturing cost. Besides, under a situation where an input voltage Vin is normal (i.e., when an input voltage Vin is relatively high), these low threshold voltage transistors will generate undesirable leakage current, thus causing unwanted power consumption.

As compared to the prior art in FIG. 1, the present invention is advantageous in that: the switching regulator of the present invention can adopt a transistor having a general type threshold voltage as a power switch, and it is not required to switch the threshold voltage of the power switch. As compared to the prior art in FIG. 2, the present invention is advantageous in that: the switching regulator of the present invention can effectively avoid current leakage. In addition, the devices required in the present invention can be made by manufacturing steps and masks which can be used for manufacturing other devices, thus reducing the manufacturing cost.

SUMMARY OF THE INVENTION

From one perspective, the present invention provides a switching regulator having a low start-up voltage, wherein the switching regulator having the low start-up voltage is configured to operably convert an input voltage to an output voltage, the switching regulator having the low start-up voltage comprising: a power stage; and a switch control circuit coupled to the power stage; wherein the power stage includes: an inductor; and at least one power switch coupled to the inductor; wherein the switch control circuit is configured to operably generate a power switch control signal according to the input voltage, to control the at least one power switch to control an effect of the inductor on a coupling relationship among the input voltage, the output voltage and a ground voltage level, thereby converting the input voltage to an output voltage; the switch control circuit including: a power control switch, which is configured to operably, according to a power control signal, electrically connect or disconnect an electrical connection path formed between the input voltage and a first input voltage related signal; a first oscillator coupled to the power control switch, the first oscillator being powered by the first input voltage related signal, the first oscillator being configured to operably generate a first clock signal; a first charge pump coupled to the first oscillator, the first charge pump being powered by the first input voltage related signal, wherein the first charge pump is configured to operably generate a second input voltage related signal according to the first clock signal, wherein a voltage level of the second input voltage related signal is higher than a voltage level of the first input voltage related signal; a second oscillator coupled to the first charge pump, the second oscillator being powered by the second input voltage related signal, the second oscillator being configured to operably generate a second clock signal; and a driver circuit coupled between the second oscillator and the power switch, the driver circuit being powered by the second input voltage related signal, wherein the driver circuit is configured to operably generate the power switch control signal according to the second clock signal, to control an operation of the power switch, wherein the second clock signal determines a duty ratio of the power switch control signal; wherein the power control switch is a low threshold voltage transistor having a first conductivity type, which is formed in a semiconductor substrate; wherein the low threshold voltage transistor having the first conductivity type includes a first lightly doped region having a second conductivity type, which forms a channel region of the low threshold voltage transistor having the first conductivity type, and wherein the semiconductor substrate includes a second lightly doped region having the second conductivity type which is formed by a same manufacturing process as the first lightly doped region having the second conductivity type, wherein the second lightly doped region having the second conductivity type forms a drift region of a high-voltage transistor having the second conductivity type in the semiconductor substrate.

In one embodiment, during a manufacturing process for forming the low threshold voltage transistor having the first conductivity type, a threshold voltage adjustment region having the first conductivity type for adjusting a threshold voltage of the low threshold voltage transistor having the first conductivity type is formed without defining a threshold voltage adjustment mask on the first lightly doped region having the second conductivity type.

In one embodiment, an absolute value of a threshold voltage of the low threshold voltage transistor having the first conductivity type is lower than an absolute value of a threshold voltage of the power switch.

In one embodiment, the semiconductor substrate includes a general type threshold voltage transistor; wherein an absolute value of a threshold voltage of the low threshold voltage transistor having the first conductivity type is lower than an absolute value of a threshold voltage of the general type threshold voltage transistor.

In one embodiment, the switch control circuit further includes: a buffer circuit coupled between the first oscillator and the first charge pump, the buffer circuit being configured to operably generate the first clock signal according to a first initial clock signal generated from the first oscillator.

In one embodiment, the semiconductor substrate further includes a low threshold voltage transistor having a second conductivity type, and wherein: (1) the first oscillator includes at least one low threshold voltage transistor having the first conductivity type; (2) the first oscillator includes at least one low threshold voltage transistor having the second conductivity type; (3) the buffer circuit includes at least one low threshold voltage transistor having the first conductivity type; (4) the buffer circuit includes at least one low threshold voltage transistor having the second conductivity type; (5) the first charge pump includes at least one low threshold voltage transistor having the first conductivity type; (6) the first charge pump includes at least one low threshold voltage transistor having the second conductivity type; or (7) a combination of more than two of the above-mentioned conditions (1) to (6); wherein the low threshold voltage transistor having the second conductivity type is formed in the semiconductor substrate, and wherein the semiconductor substrate forms a channel region of the low threshold voltage transistor having the second conductivity type.

In one embodiment, during a manufacturing process for forming the low threshold voltage transistor having the second conductivity type, a threshold voltage adjustment region having the second conductivity type for adjusting a threshold voltage of the low threshold voltage transistor having the second conductivity type is formed without defining a second conductivity type threshold voltage adjustment mask on the semiconductor substrate.

In one embodiment, the first oscillator includes: an odd number of NOT gates powered by the first input voltage related signal, to generate a first clock signal, wherein the odd number is equal to or greater than three; wherein the odd number of NOT gates form a ring oscillator; wherein each of the odd number of NOT gates includes a pull-up switch and a pull-down switch; wherein the pull-up switch is formed by the low threshold voltage transistor having the first conductivity type, whereas, the pull-down switch is formed by the low threshold voltage transistor having the second conductivity type.

In one embodiment, the switch control circuit further includes: a second charge pump coupled to the power control switch, wherein the second charge pump is configured to operably pump the input voltage to generate the power control signal; wherein the power control signal turns OFF the power control switch by a voltage level higher than a level of the input voltage, to avoid current leakage through the power control switch.

In one embodiment, the second charge pump generates the power control signal by pumping the input voltage to approximately a sum of the input voltage plus the output voltage or approximately two-fold of the input voltage.

In one embodiment, the semiconductor substrate further includes an adjustable threshold voltage transistor having the second conductivity type; wherein the second charge pump includes: a first pumping switch; and a second pumping switch coupled to the first pumping switch; wherein the first pumping switch and the second pumping switch are configured to operably pump the input voltage to generate the power control signal, wherein the first pumping switch is formed by the low threshold voltage transistor having the first conductivity type, whereas, the second pumping switch is formed by the adjustable threshold voltage transistor having the second conductivity type; wherein a body electrode of the second pumping switch is adjusted to a bias voltage signal, so as to adjust a threshold voltage of the second pumping switch.

In one embodiment, the switch control circuit further includes: a level shifting switch, which is connected in series between the power control switch and the first input voltage related signal, wherein the level shifting switch is formed by the low threshold voltage transistor having the first conductivity type; wherein the level shifting switch is configured to operably clamp a drain voltage of the power control switch, so that a drain-gate voltage of the power control switch is not greater than a voltage limit, thereby improving reliability of the power control switch.

In one embodiment, the switch control circuit further includes: an operation control circuit which is powered by the input voltage, the operation control circuit being configured to operably control an enabled mode, a disabled mode or an operation mode of at least one of the first oscillator, the first charge pump, the buffer circuit and the second charge pump; wherein operation control circuit includes: at least one logic circuit which is powered by the input voltage, the at least one logic circuit having at least one pull-up switch and at least one pull-down switch; wherein the pull-up switch is formed by the low threshold voltage transistor having the first conductivity type, whereas, the pull-down switch is formed by the adjustable threshold voltage transistor having the second conductivity type; wherein a body electrode of the at least one pull-down switch is adjusted to the bias voltage signal, so as to lower down a threshold voltage of the at least one pull-down switch.

In one embodiment, the first conductivity type is P-type, while the second conductivity type is N-type.

In one embodiment, the low threshold voltage transistor having the second conductivity type is a native NMOS transistor.

In one embodiment, the switching regulator having the low start-up voltage is a boost switching regulator, wherein the inductor has one end coupled to the input voltage, and wherein the power switch is configured to operably switch another end of the inductor between the output voltage and the ground voltage level.

From another perspective, the present invention provides a switch control circuit configured to operably control a switching regulator having a low start-up voltage, for converting an input voltage to an output voltage, wherein the switching regulator having the low start-up voltage includes: a power stage; and a switch control circuit coupled to the power stage; wherein the power stage includes: an inductor; and at least one power switch coupled to the inductor; wherein the switch control circuit is configured to operably generate a power switch control signal according to the input voltage, to control the at least one power switch to control a coupling relationship of the inductor with the input voltage, the output voltage and a ground voltage level, thereby converting the input voltage to the output voltage; the switch control circuit comprising: a power control switch, which is configured to operably, according to a power control signal, electrically connect or disconnect an electrical connection path formed between the input voltage and a first input voltage related signal; a first oscillator coupled to the power control switch, the first oscillator being powered by the first input voltage related signal, the first oscillator being configured to operably generate a first clock signal; a first charge pump coupled to the first oscillator, the first charge pump being powered by the first input voltage related signal, wherein the first charge pump is configured to operably generate a second input voltage related signal according to the first clock signal, wherein a voltage level of the second input voltage related signal is higher than a voltage level of the first input voltage related signal; a second oscillator coupled to the first charge pump, the second oscillator being powered by the second input voltage related signal, wherein the second oscillator is configured to operably generate a second clock signal; and a driver circuit coupled between the second oscillator and the power switch, the driver circuit being powered by the second input voltage related signal, wherein the driver circuit is configured to operably generate the power switch control signal according to the second clock signal, to control an operation of the power switch, wherein the second clock signal determines a duty ratio of the power switch control signal; wherein the power control switch is a low threshold voltage transistor having a first conductivity type, which is formed in a semiconductor substrate; wherein the low threshold voltage transistor having the first conductivity type includes a first lightly doped region having a second conductivity type, which forms a channel region of the low threshold voltage transistor having the first conductivity type, and wherein the semiconductor substrate includes a second lightly doped region having the second conductivity type which is formed by a same manufacturing process as the first lightly doped region having the second conductivity type, wherein the second lightly doped region having the second conductivity type forms adrift region of a high-voltage transistor having the second conductivity type in the semiconductor substrate.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 3:
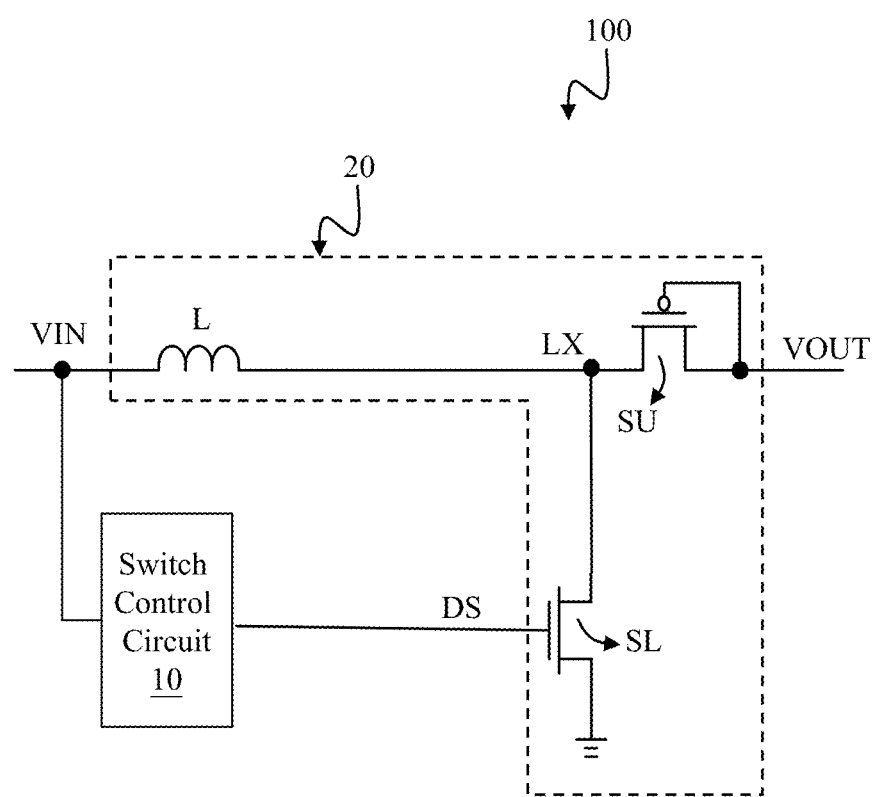
FIG. 3 shows a schematic block diagram of a switching regulator having a low start-up voltage according to an embodiment of the present invention.

Please refer to FIG. 3, which shows a schematic block diagram of a switching regulator (i.e., switching regulator 100) having a low start-up voltage according to an embodiment of the present invention. The switching regulator 100 is configured to operably convert an input voltage VIN to an output voltage VOUT. The switching regulator 100 comprises a power stage 20 and a switch control circuit 10. The power stage 20 includes an inductor L and at least one power switch (for example, the power switch SL shown in FIG. 3), which are coupled to each other. The switch control circuit 10 is configured to operably generate a power switch control signal DS according to the input voltage VIN, to control the power switch SL to control a coupling relationship between the inductor L with the input voltage VIN, the output voltage VOUT and a ground voltage level, thereby converting the input voltage VIN to the output voltage VOUT.

In one embodiment, the switching regulator of the present invention can be, for example but not limited to, a boost switching regulator (for example, as shown by the switching regulator 100 in FIG. 3). In this embodiment, the inductor L has one end coupled to the input voltage VIN. The power switch SL (which is a lower gate switch of the power stage 20) is configured to operably switch another end of the inductor L between the output voltage VOUT and the ground voltage level. In one embodiment, as shown in FIG. 3, a higher gate switch of the power stage 20 can be, for example but not limited to, a diode-coupled transistor SU. Certainly, it should be understood that the boost switching regulator in the above-mentioned preferred embodiment is only an illustrative example, but not for limiting the scope of the present invention. In other embodiments, it is also practicable and within the scope of the present invention that the switching regulator can be any other type of switching regulator.

Figure 4:
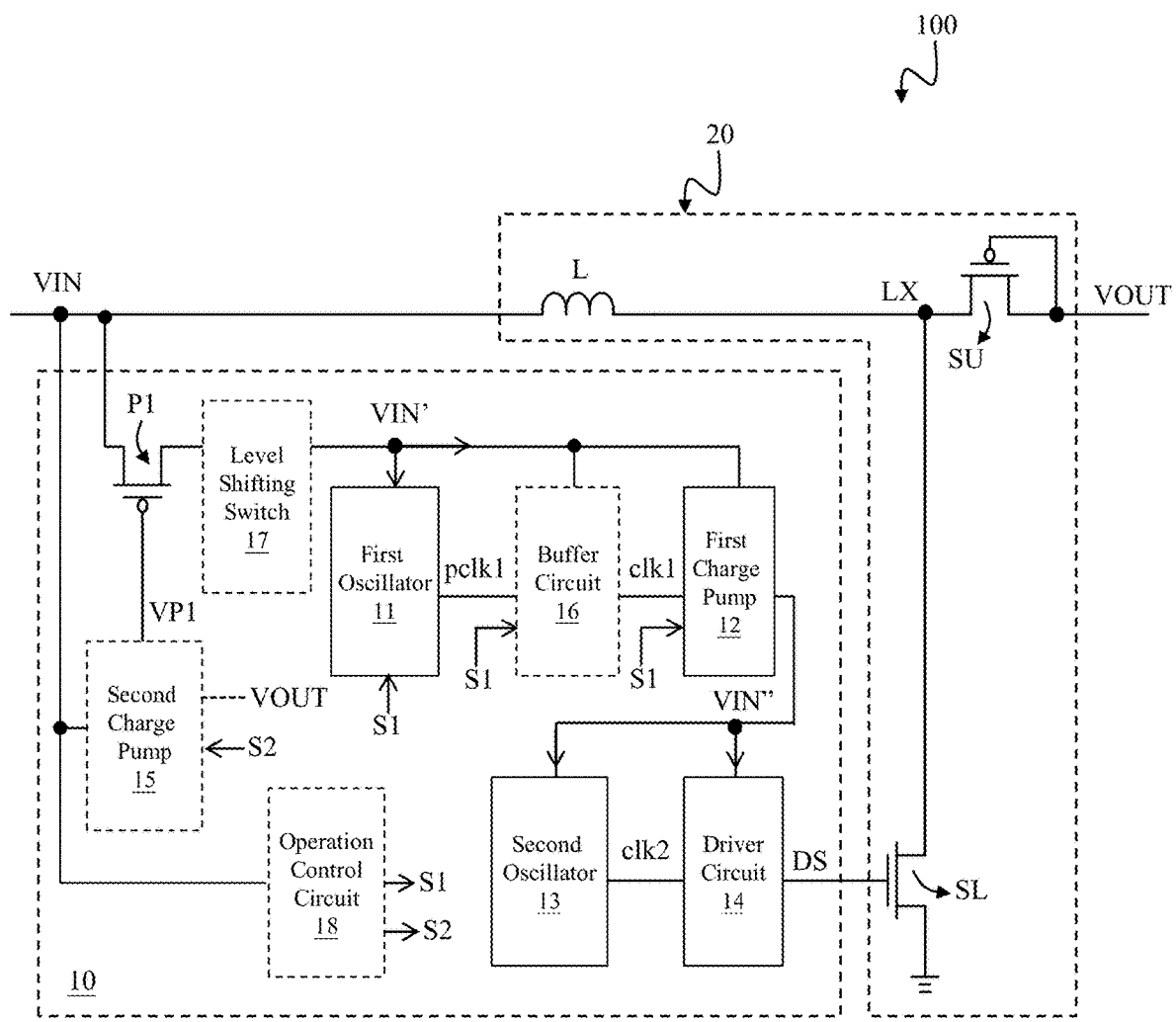
FIG. 4 shows an embodiment of a switch control circuit of the present invention.
Figure 5:
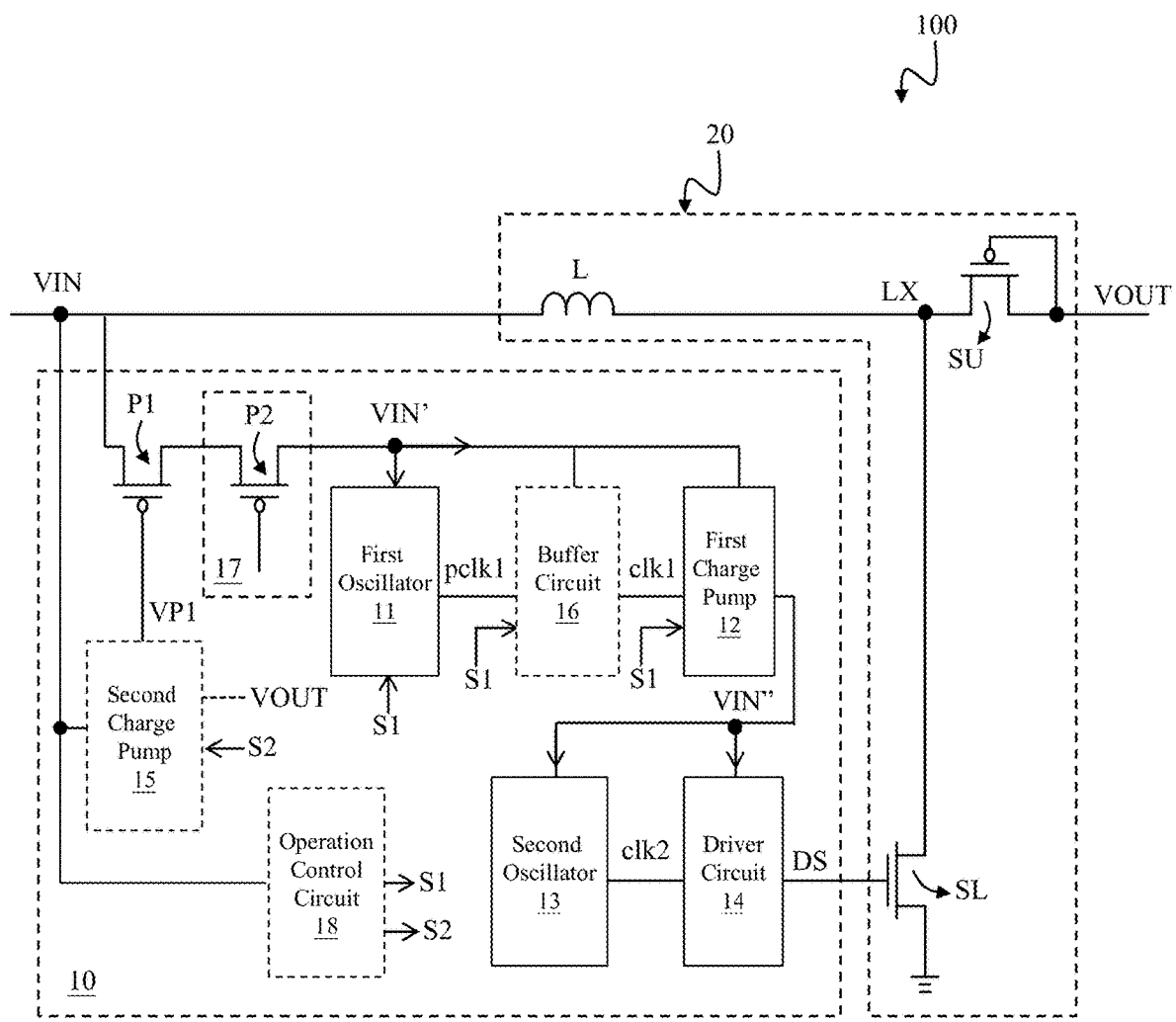
FIG. 5 shows a schematic diagram of a switching regulator having a low start-up voltage according to an embodiment of the present invention.

Please refer to FIG. 4, which shows an embodiment of a switch control circuit of the present invention. In one embodiment, as shown in FIG. 4, the switch control circuit 10 includes: a power control switch P1, a first oscillator 11, a first charge pump 12, a second oscillator 13 and a driver circuit 14.

Please still refer to FIG. 4. The power control switch P1 is configured to operably, according to a power control signal VP1, electrically connect or disconnect an electrical connection path formed between the input voltage VIN and a first input voltage related signal VIN'. The first oscillator 11 is coupled to the power control switch P1 and is powered by the first input voltage related signal VIN'. The first oscillator 11 is configured to operably generate a first clock signal clk1. The first charge pump 12 is coupled to the first oscillator 11 and is powered by the first input voltage related signal VIN'. The first charge pump 12 is configured to operably generate a second input voltage related signal VIN" according to the first clock signal clk1. A voltage level of the second input voltage related signal VIN" is higher than a voltage level of the first input voltage related signal VIN'. From one perspective, the first charge pump 12 operates according to the first clock signal clk1, to pump the first input voltage related signal VIN' to the second input voltage related signal VIN", and provide power to the second oscillator 13 and the driver circuit 14 by the thus obtained second input voltage related signal VIN".

Please still refer to FIG. 4. The second oscillator 13 is coupled to the first charge pump 12 and is powered by the second input voltage related signal VIN". The second oscillator 13 is configured to operably generate a second clock signal clk2. The driver circuit 14 is coupled between the second oscillator 13 and the power switch SL and is powered by the second input voltage related signal VIN". The driver circuit 14 is configured to operably generate the power switch control signal DS according to the second clock signal clk2, to control an operation of the power switch SL. In one embodiment, the switch control circuit 10 starts up the operation of the switching regulator 100 when the input voltage VIN is still low, to generate a preliminary output voltage VOUT. For example, the switch control circuit 10 starts up the operation of the switching regulator 100 when the input voltage VIN is smaller than or equal to 1V. In one embodiment, in this case, the second clock signal clk2 determines a duty ratio of the power switch control signal DS generated by the driver circuit 14. That is, in one embodiment, the switch control circuit 10 can control the power stage 20 by open-loop control through a duty ratio of the second clock signal clk2, to convert the input voltage VIN to the output voltage VOUT. Thus, the switching regulator 100 of this embodiment can be started up under a low input voltage VIN. Certainly, it should be understood that such open-loop control is only one of many possible embodiments. In other embodiments, it is also practicable and within the scope of the present invention that the second clock signal clk2 can be generated by close-loop control. Under such situation, the second clock signal clk2 can be a clock signal generated by feedback control.

Figure 7A:
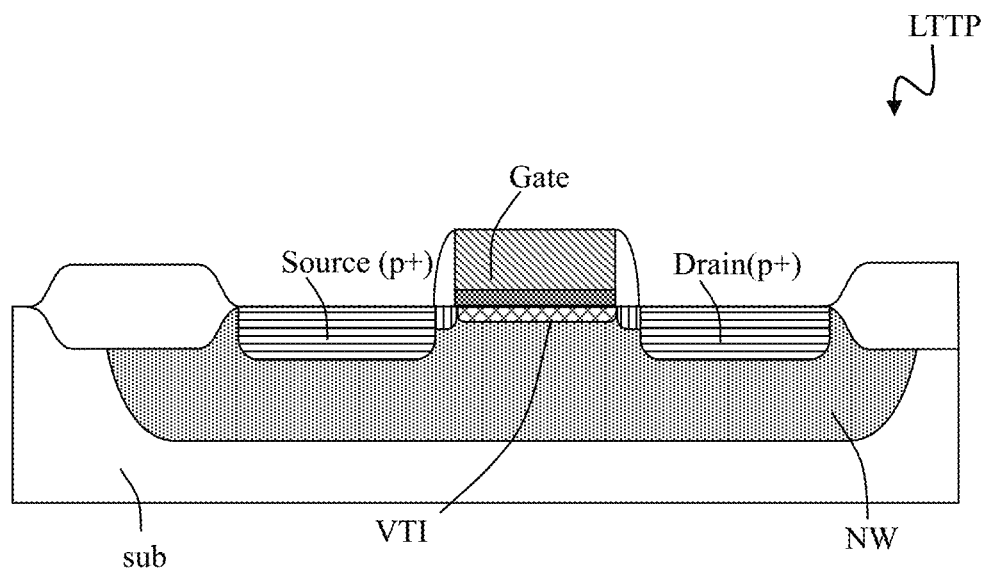
FIG. 7A shows a schematic cross-sectional diagram of a prior art low threshold voltage transistor.
Figure 7B:
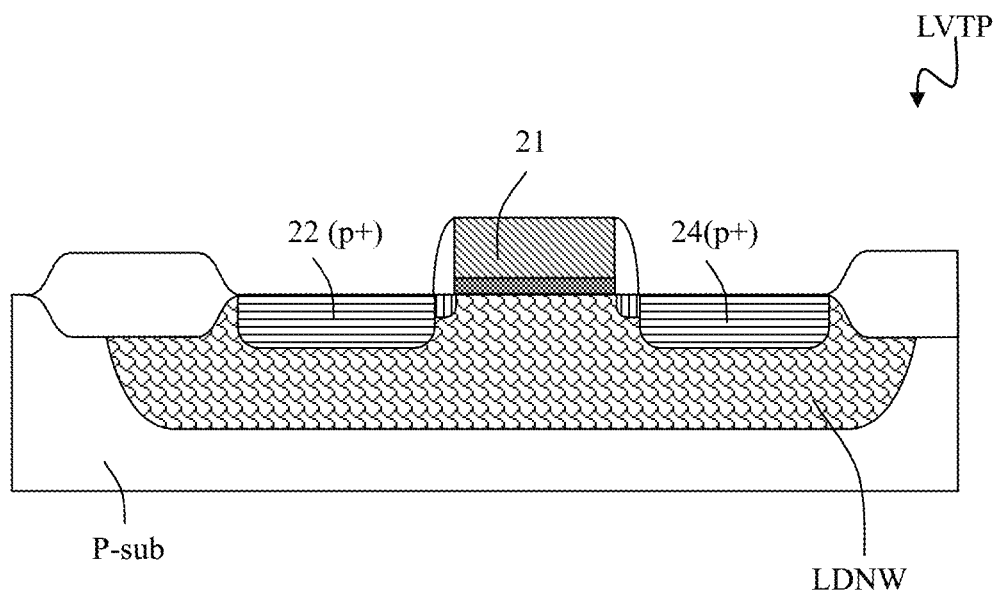
FIG. 7B shows a schematic cross-sectional diagram of a low threshold voltage transistor having a first conductivity type according to an embodiment of the present invention.

Please refer to FIG. 4 along with FIG. 7B. FIG. 7B shows a schematic cross-sectional diagram of a low threshold voltage transistor (i.e., low threshold voltage transistor LVTP) having a first conductivity type according to an embodiment of the present invention. In one embodiment, the first conductivity type can be for example but not limited to P-type. As shown in FIG. 4, in one embodiment, the power control switch P1 is formed by the above-mentioned low threshold voltage transistor LVTP having for example P-type, which is formed in a semiconductor substrate P-sub (as shown in FIG. 7B, in one embodiment, the semiconductor substrate P-sub is for example a P-type semiconductor substrate). As shown in FIG. 7B, the low threshold voltage transistor LVTP includes a lightly doped region LDNW having a second conductivity type. The lightly doped region LDNW forms a channel region of the low threshold voltage transistor LVTP. In more detail, the channel region of the low threshold voltage transistor LVTP as illustrated in FIG. 7B is formed in a portion of the lightly doped region LDNW beneath the gate 21, and when the low threshold voltage transistor LVTP is applied with an appropriate bias voltage, the carriers of this portion of the lightly doped region LDNW which is beneath the gate 21 (i.e., the channel region) will be inverted form their original conductivity type to an opposite conductivity type to form the channel region.

Figure 1:
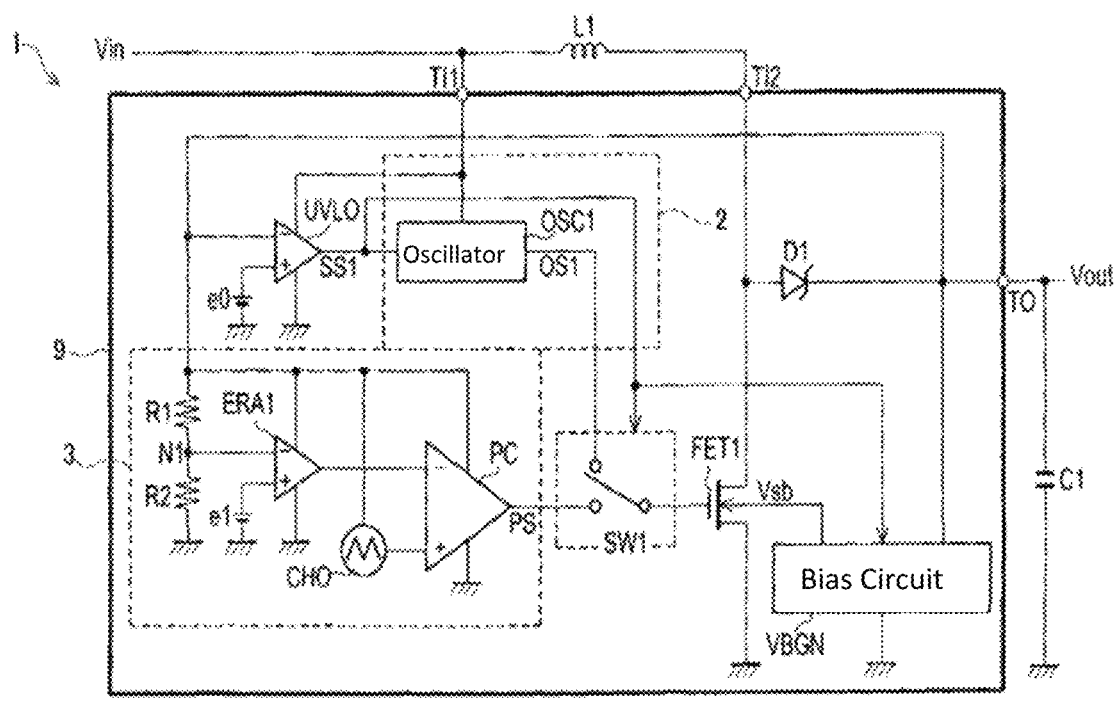
FIG. 1 shows a schematic diagram of a prior art switching regulator.
Figure 2:
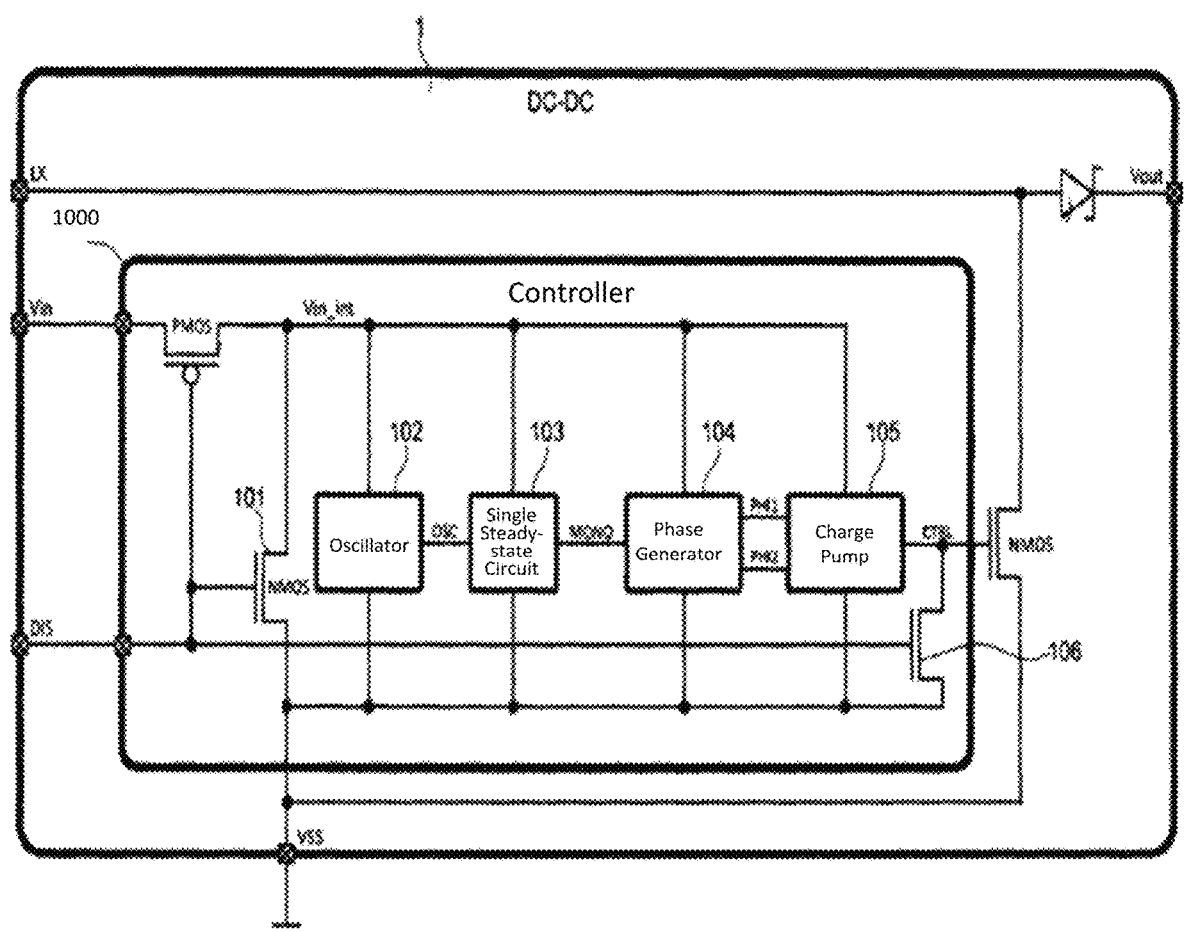
FIG. 2 shows a schematic diagram of another prior art switching regulator.

Please refer to FIG. 7A, which shows a schematic cross-sectional diagram of a prior art low threshold voltage transistor LTTP (which corresponds to, for example, the low threshold voltage transistor adopted by the prior art switching regulator shown in FIG. 2). As shown in FIG. 7A, during a manufacturing process for forming this prior art low threshold voltage transistor LTTP, it is required for this prior art to define a threshold voltage adjustment region VTI by applying a threshold voltage adjustment mask (not shown) on a well NW, so that a threshold voltage of this prior art low threshold voltage transistor LTTP can be adjusted. As compared to the prior art low threshold voltage transistor LTTP shown in FIG. 7A, in one embodiment of the present invention, preferably, during a manufacturing process for forming the low threshold voltage transistor LVTP of the present invention, a threshold voltage adjustment region having the first conductivity type is formed without applying a threshold voltage adjustment mask on the lightly doped region LDNW; thus, the present invention can form the low threshold voltage transistor LVTP with a desired threshold voltage by a lower manufacturing cost.

Figure 7C:
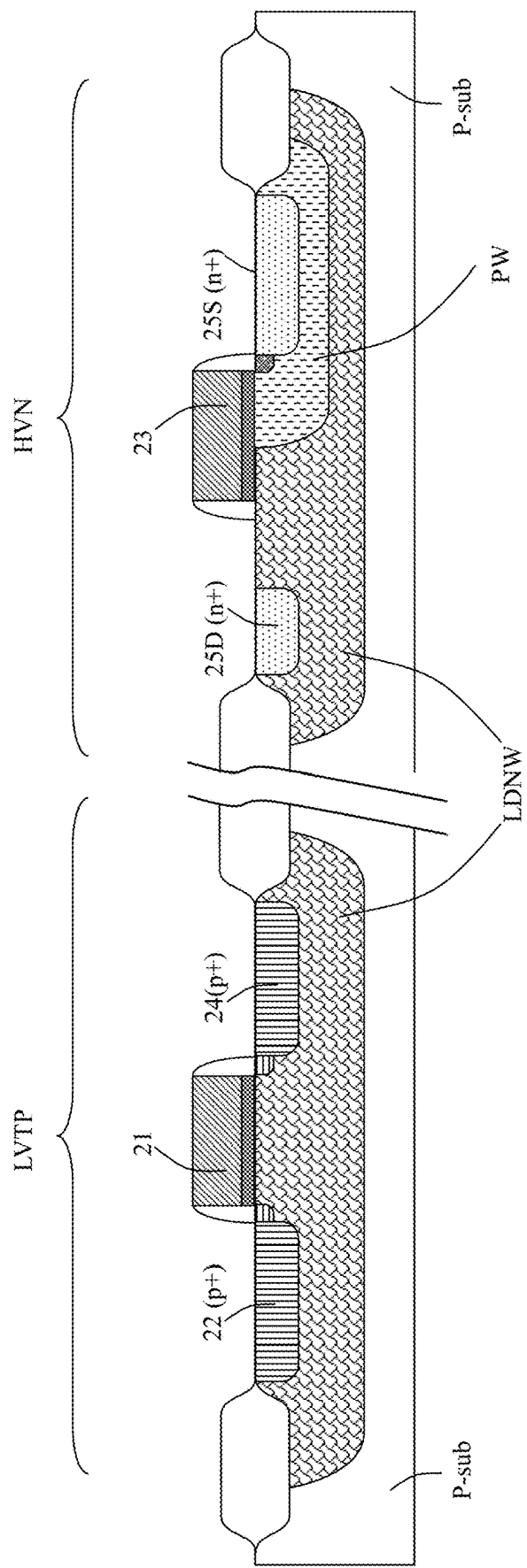
FIG. 7C shows a schematic cross-sectional diagram of a high-voltage transistor having a second conductivity type according to an embodiment of the present invention.
Figure 7D:
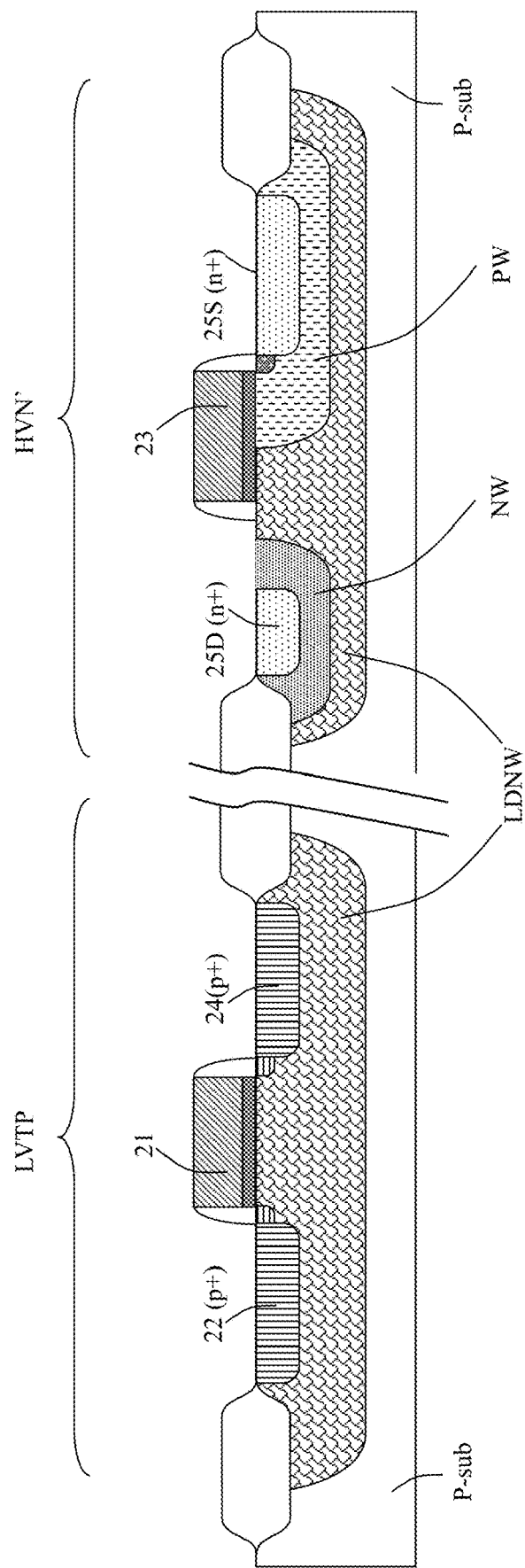
FIG. 7D shows a schematic cross-sectional diagram of a high-voltage transistor having a second conductivity type according to another embodiment of the present invention.

Please refer both to FIG. 7C and FIG. 7D. FIG. 7C shows a schematic cross-sectional diagram of a high-voltage transistor (i.e., high-voltage transistor HVN) having a second conductivity type according to an embodiment of the present invention. FIG. 7D shows a schematic cross-sectional diagram of a high-voltage transistor (i.e., high-voltage transistor HVN') having a second conductivity type according to another embodiment of the present invention. In the embodiments shown in FIG. 7C and FIG. 7D, the semiconductor substrate P-sub includes another lightly doped region LDNW having the second conductivity type which is formed by a same manufacturing process as the lightly doped region LDNW illustrated in FIG. 7B. The lightly doped regions LDNW in the high-voltage transistors HVN and HVN' shown in FIG. 7C and FIG. 7D form the drift regions of the high-voltage transistors HVN and HVN', respectively. In the embodiment shown in FIG. 7C and FIG. 7D, the lightly doped region LDNW in the low threshold voltage transistor LVTP forms a channel region of the low threshold voltage transistor LVTP. As shown in FIG. 7C, in one embodiment, the drift region is in contact with the drain 25D of the high-voltage transistor HVN along a channel direction, and the drain 25D and the gate 23 are separated by the lightly doped region LDNW along the channel direction; and, as shown in FIG. 7C, in the high-voltage transistor HVN, the drain 25D and the well PW having a first conductivity type (in which the channel region of the high-voltage transistor HVN is located) are separated by the lightly doped region LDNW along the channel direction, whereby the high-voltage transistor HVN is configured to operate under a high voltage. The high-voltage transistor HVN' shown in FIG. 7D is substantially the same as the high-voltage transistor HVN shown in FIG. 7C, but is different in that: the drain 25D of the high-voltage transistor HVN' shown in FIG. 7D includes a well NW having a second conductivity type. In one embodiment, a doping concentration of the well NW is higher than a doping concentration of the lightly doped region LDNW but is lower than a doping concentration of the drain 25D. Note that the channel region of the high-voltage transistor (HVN or HVN') as illustrated in FIG. 7C or FIG. 7D is located in=n a portion of the well PW beneath the gate 23.

Figure 7E:
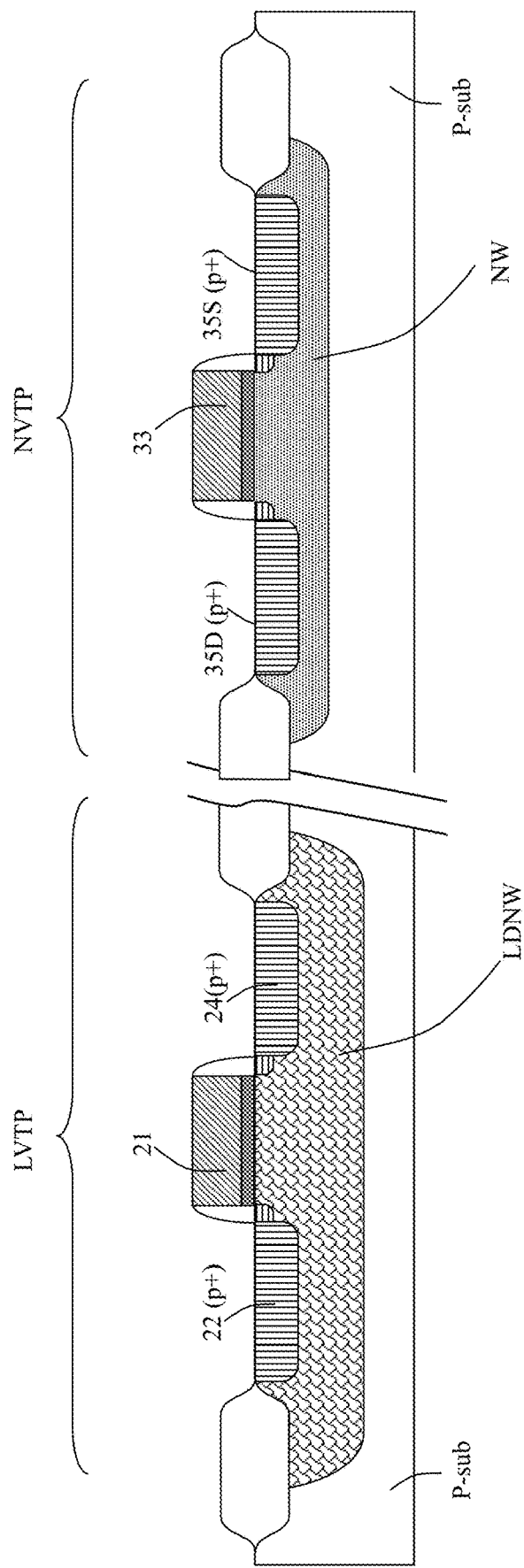
FIG. 7E shows a schematic cross-sectional diagram of a general type threshold voltage transistor according to an embodiment of the present invention.
Figure 7F:
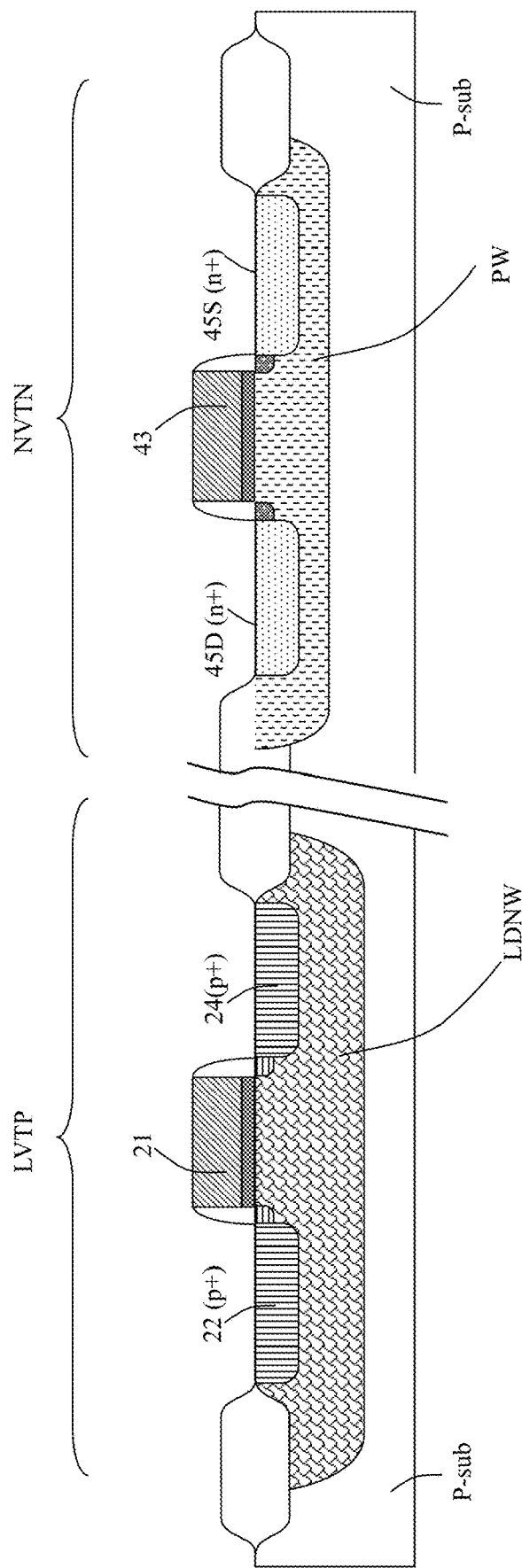
FIG. 7F shows a schematic cross-sectional diagram of a general type threshold voltage transistor according to another embodiment of the present invention.

Please refer to FIG. 7E, which shows a schematic cross-sectional diagram of a general type threshold voltage transistor according to an embodiment of the present invention. According to the present invention, in one embodiment, a general type threshold voltage transistor NVTP (as shown in FIG. 7E) having a first conductivity type and/or a general type threshold voltage transistor NVTN (as shown in FIG. 7F) having a second conductivity type is also formed on the same semiconductor substrate P-sub. Note that, these two types of transistors (i.e., NVTP and NVTN) are referred to as "general type threshold voltage transistor" because the threshold voltage of such general type threshold voltage transistor is more common than the threshold voltages of other types of transistors, or, by a different way of definition, an absolute value of the threshold voltage of the above-mentioned low threshold voltage transistor LVTP is lower than an absolute value of the threshold voltage of the general type threshold voltage transistor (i.e., NVTP or NVTN).

As shown in FIG. 7E, for example, the general type threshold voltage transistor NVTP includes a well NW having a second conductivity type. The portion of the well NW beneath the gate 33 forms a channel region of the general type threshold voltage transistor NVTP. Because a doping concentration of the lightly doped region LDNW is lower than a doping concentration of the well NW, an absolute value of a threshold voltage of the low threshold voltage transistor LVTP is lower than an absolute value of a threshold voltage of the general type threshold voltage transistor NVTP.

For reference, the term "low threshold voltage", refers to an absolute value of a threshold voltage which is lower than 0.3V, while the term "general type threshold voltage", refers to an absolute value of a threshold voltage which is higher than 0.6V.

In one embodiment, the power switch SL shown in FIG. 4 can be formed by the above-mentioned general type threshold voltage transistor (for example, the general type threshold voltage transistor NVTP or the general type threshold voltage transistor NVTN). In one embodiment, an absolute value of the threshold voltage of the above-mentioned low threshold voltage transistor LVTP is lower than an absolute value of the threshold voltage of the power switch SL.

Figure 8A:
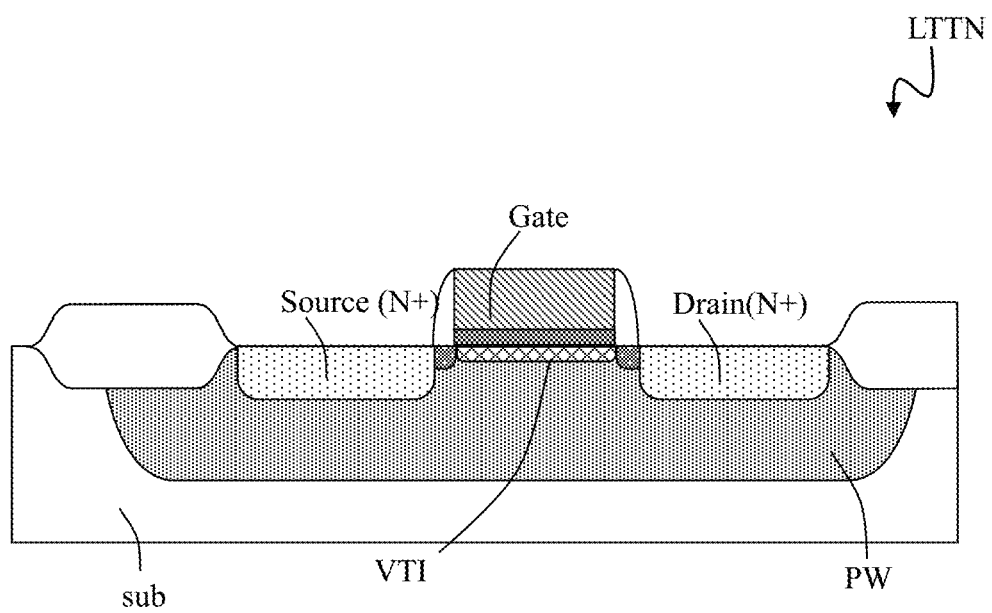
FIG. 8A shows a schematic cross-sectional diagram of another prior art low threshold voltage transistor.
Figure 8B:
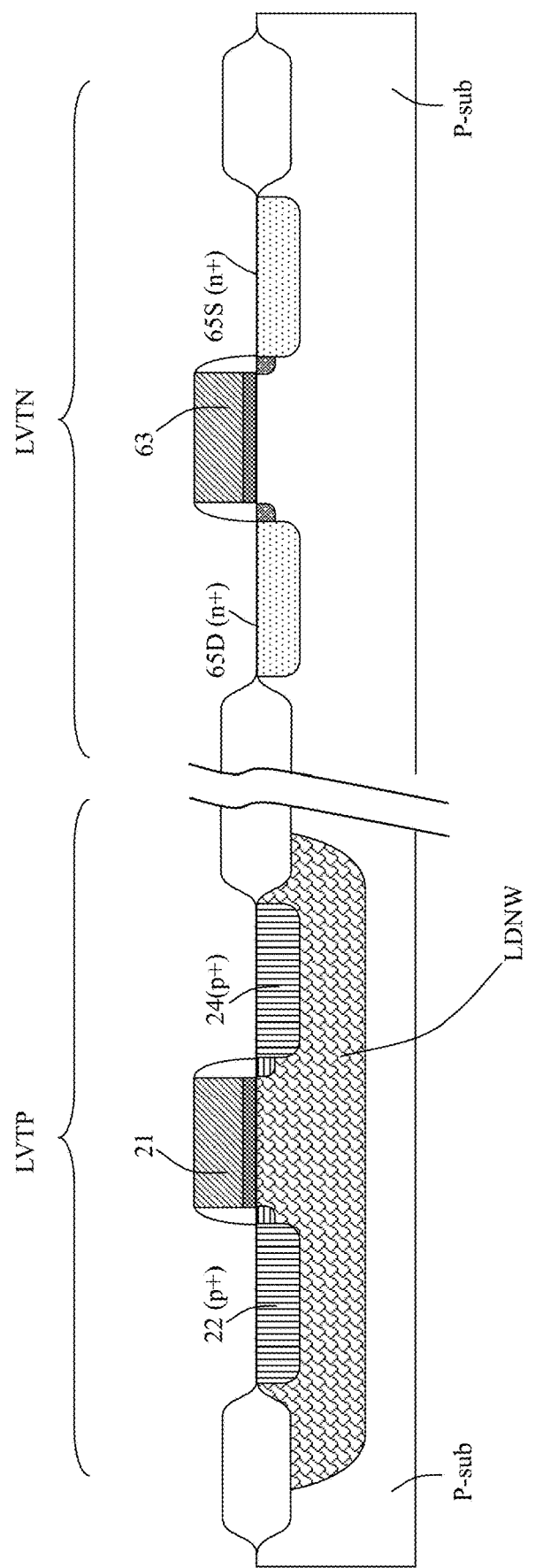
FIG. 8B shows a schematic cross-sectional diagram of a low threshold voltage transistor having a second conductivity type according to an embodiment of the present invention.

Please refer to FIG. 8B, which shows a schematic cross-sectional diagram of a low threshold voltage transistor having a second conductivity type according to an embodiment of the present invention. In one embodiment, a low threshold voltage transistor LVTN is formed in the semiconductor substrate P-sub, wherein the semiconductor substrate P-sub forms a channel region of the low threshold voltage transistor LVTN. In more detail, the channel region is located in the semiconductor substrate P-sub beneath the gate 63; when the low threshold voltage transistor LVTN is applied with an appropriate bias voltage, the carriers of this portion which is beneath the gate 21 (i.e., the channel region) will be inverted form their original conductivity type to an opposite conductivity type to form the channel region. In one embodiment, the low threshold voltage transistor LVTN is a native N-type Metal-Oxide-Semiconductor (NMOS) transistor.

Please refer to FIG. 8A, which shows a schematic cross-sectional diagram of a prior art low threshold voltage transistor LTTN (which corresponds to, for example, the low threshold voltage transistor adopted by the prior art switching regulator shown in FIG. 2). As shown in FIG. 8A, during a manufacturing process for forming this prior art low threshold voltage transistor LTTN, it is required for this prior art to define a threshold voltage adjustment region VTI by applying a threshold voltage adjustment mask (not shown) on a well PW, so that the threshold voltage of this prior art low threshold voltage transistor LTTN can be adjusted. As compared to the prior art low threshold voltage transistor LTTN shown in FIG. 8A, in one embodiment, preferably, during a manufacturing process for forming the low threshold voltage transistor LVTN of the present invention, the present invention can define a threshold voltage adjustment region having the second conductivity type without applying a threshold voltage adjustment mask on the semiconductor substrate P-sub; thus, the present invention can form the low threshold voltage transistor LVTN with a desired threshold voltage by a lower manufacturing cost.

Figure 6A:
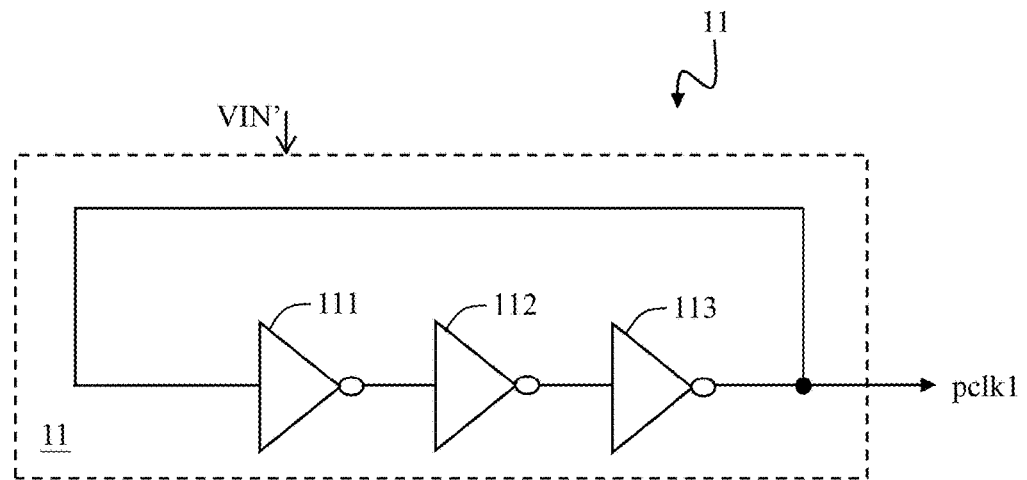
FIGS. 6A-6B show the embodiments of a first oscillator of the present invention.
Figure 6B:
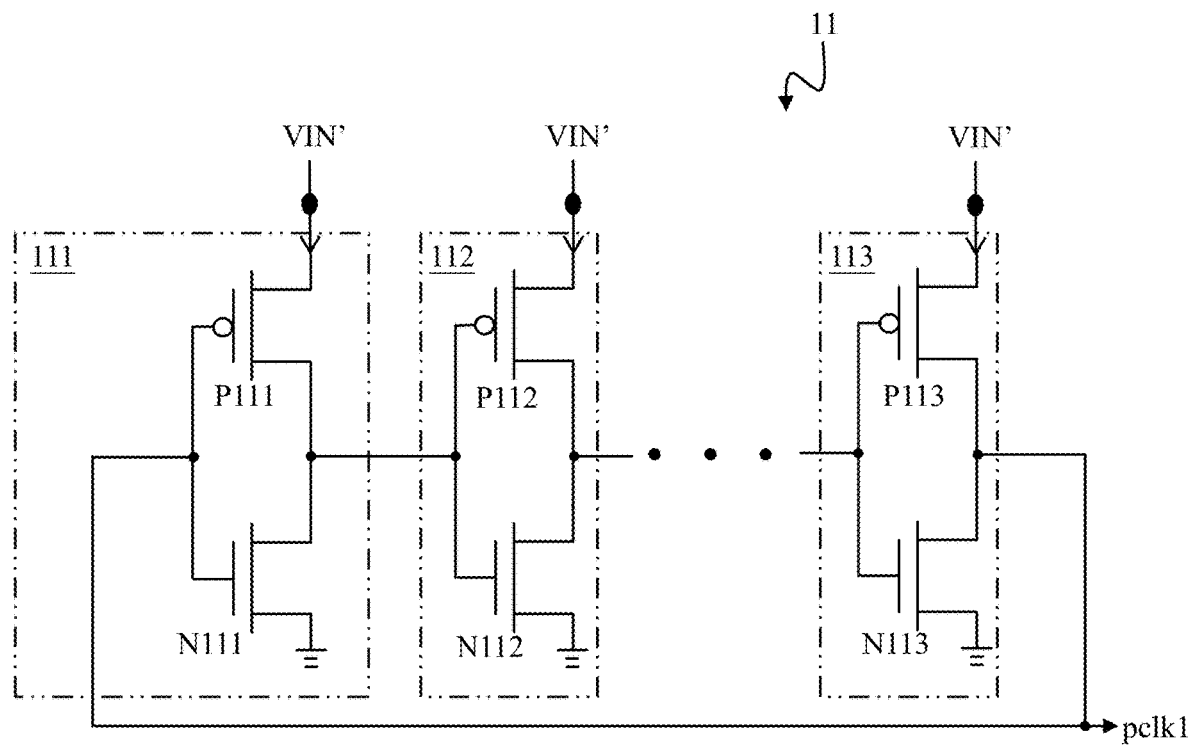

Please refer to FIGS. 6A-6B, which show embodiments of a first oscillator (i.e., first oscillator 11) of the present invention. The first oscillator 11 includes an odd number of NOT gates, wherein the odd number is equal to or greater than three (such as the three NOT gates 111, 112 and 113 in FIG. 6A). The first oscillator 11 is powered by the first input voltage related signal VIN', so as to generate the first clock signal clk1. As shown in FIG. 6A, in one embodiment, the three NOT gates 111, 112 and 113 form a ring oscillator. Each of the NOT gates 111, 112 and 113 includes a pull-up switch (i.e., P111, P112 or P113 in FIG. 6B) and a pull-down switch (i.e., N111, N112 or N113 in FIG. 6B). In one embodiment, the pull-up switch (i.e., P111, P112 or P113) is formed by the low threshold voltage transistor LVTP. In one embodiment, the pull-down switch (i.e., N111, N112 or N113) is formed by the low threshold voltage transistor LVTN. In one embodiment, the first oscillator 11 includes at least one low threshold voltage transistor LVTP, and in one embodiment, the first oscillator 11 includes at least one low threshold voltage transistor LVTN, such that the first oscillator 11 can operate under the above-mentioned circumstance of low input voltage VIN. Certainly, it should be understood that a ring oscillator in this embodiment is only an illustrative example, but not for limiting the scope of the present invention. In other embodiments, it is also practicable and within the scope of the present invention that the first oscillator 11 can be any other type of oscillator.

Figure 11:
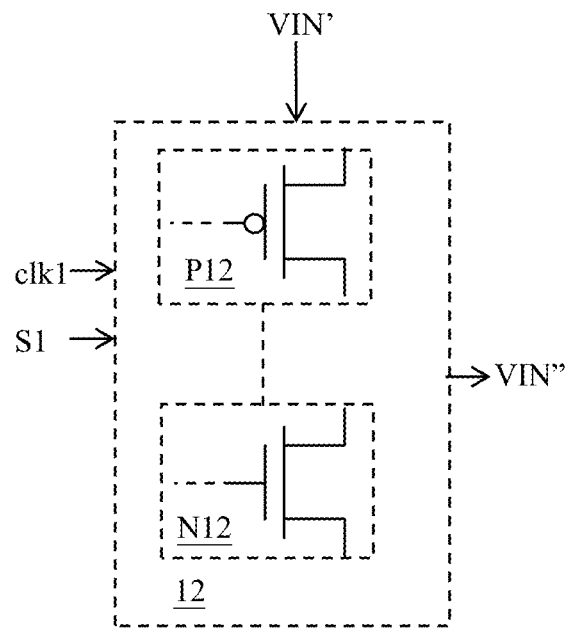
FIG. 11 shows an embodiment of a first charge pump of the present invention.

Please refer to FIG. 11, which shows an embodiment of a first charge pump (i.e., first charge pump 12) of the present invention. In one embodiment, the first charge pump 12 includes at least one low threshold voltage transistor LVTP (as shown by P12 in FIG. 11). In one embodiment, the first charge pump 12 includes at least one low threshold voltage transistor LVTN (as shown by N12 in FIG. 11), such that the first charge pump 12 can operate under the above-mentioned circumstance of low input voltage VIN. It is noteworthy that the pumping ratio (i.e., ratio of VIN" to VIN') of the first charge pump 12 can be determined depending upon practical needs, and a corresponding circuit implementation can be selected to achieve the required pumping ratio; all such circuit implementations should fall within the spirit of the present invention.

Figure 12:
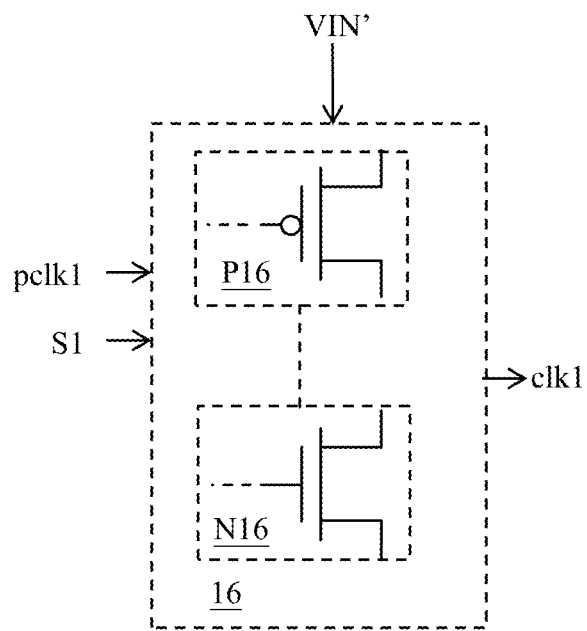
FIG. 12 shows an embodiment of a buffer circuit of the present invention.

Please refer back to FIG. 4. Because it takes a greater driving voltage to drive the first charge pump 12, in one embodiment, the switch control circuit 10 can further include a buffer circuit 16. The buffer circuit 16 is coupled between the first oscillator 11 and the first charge pump 12. The buffer circuit 16 is configured to operably generate the first clock signal clk1 according to a first initial clock signal pclk1 generated from the first oscillator 11. The buffer circuit 16 can be a same phase buffer circuit or an inverse phase buffer circuit (i.e. an inverter buffer circuit) having a high driving capability required to drive the first charge pump 12. It is noteworthy that the practical circuit implementation of the buffer circuit 16 can be determined depending upon practical needs, and all of such implementations should fall within the spirit of the present invention. Please refer to FIG. 12, which shows an embodiment of a buffer circuit (i.e., buffer circuit 16) of the present invention. In one embodiment, the buffer circuit 16 includes at least one low threshold voltage transistor LVTP (as shown by P16 in FIG. 12), and in one embodiment, the buffer circuit 16 includes at least one low threshold voltage transistor LVTN (as shown by N16 in FIG. 12), such that the buffer circuit 16 can operate under the above-mentioned circumstance of low input voltage VIN.

In addition, the number of the low threshold voltage transistor LVTP included in the above-mentioned circuits and/or the number of the low threshold voltage transistor LVTN included in the above-mentioned circuits can be determined depending upon practical needs, so that the switch control circuit 10 can operate under the above-mentioned circumstance of low input voltage VIN.

Figure 9:
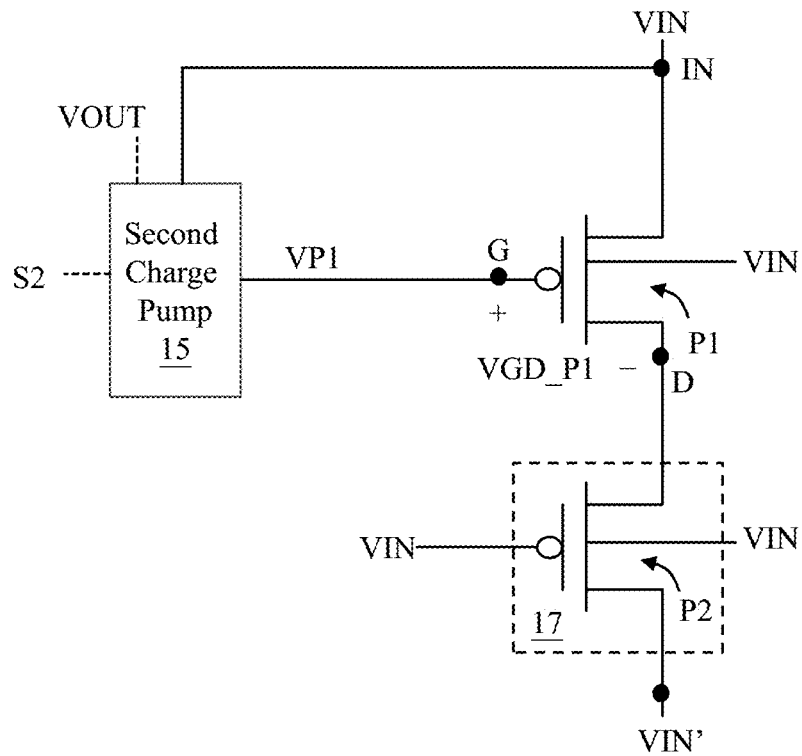
FIG. 9 shows an embodiment of a switch control circuit of the present invention.

Please refer to FIG. 9, which shows an embodiment of a switch control circuit of the present invention (only the relevant parts of the circuit are shown). As mentioned above, the low threshold voltage transistor has an undesirable amount of leakage current when its gate-source voltage is equal to zero. To overcome this drawback, in one embodiment as shown in FIG. 9, the switch control circuit 10 can further include a second charge pump 15. The second charge pump 15 is coupled to the power control switch P1. The second charge pump 15 is configured to operably pump the input voltage VIN to generate the power control signal VP1. The power control signal VP1 can turn OFF the power control switch P1 by a voltage level exceeding a level of the input voltage VIN, thereby avoiding the current leakage through the power control switch P1. In the embodiment where the power control switch P1 is a P-type (corresponding to the first conductivity type) low threshold voltage transistor LVTP (as shown in FIG. 9), that the power control signal VP1 "exceeds" a level of the input voltage VIN means that the power control signal VP1 "is higher than" a level of the input voltage VIN, whereby the power control switch P1 can be completely turned OFF without undesirable current leakage.

Please still refer to FIG. 9. In one embodiment, the switch control circuit 10 of the present invention further includes a level shifting switch P2, which is connected in series between the power control switch P1 and the first input voltage related signal VIN'. In one embodiment, the level shifting switch P2 is formed by the low threshold voltage transistor LVTP. The level shifting switch P2 is configured to operably clamp a drain voltage of the power control switch P1, for example by providing a clamping bias voltage to a gate of the level shifting switch P2. In one embodiment, the gate of the level shifting switch P2 can be biased by the input voltage VIN (as shown in FIG. 9), so that a drain-gate voltage of the power control switch P1 is not greater than a voltage limit, to improve the reliability of the power control switch P1. In this embodiment, the drain voltage of the power control switch P1 can be clamped at a voltage level which is approximately equal to a sum of the input voltage VIN plus a threshold voltage of the level shifting switch P2.

Figures 10A, 10B:
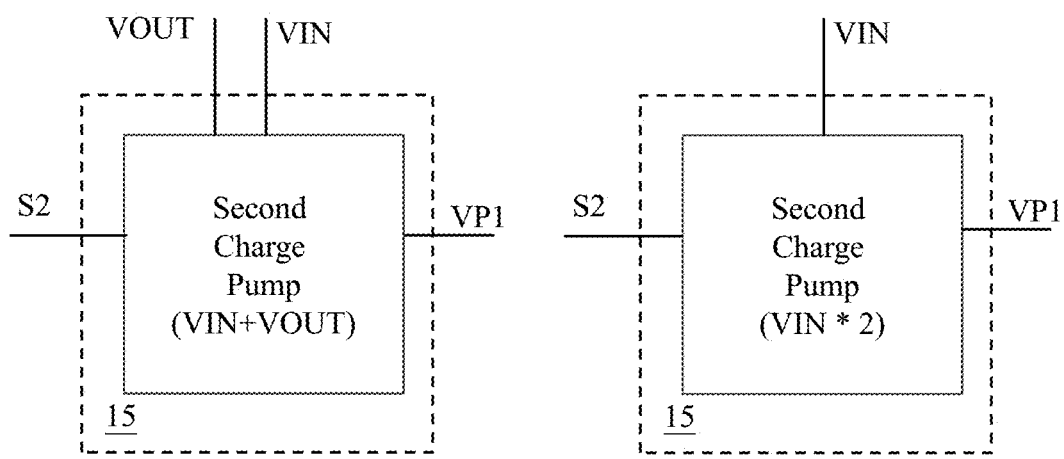
FIG. 10A shows an embodiment of a second charge pump of the present invention.
FIG. 10B shows another embodiment of a second charge pump of the present invention.

Please refer to FIG. 10A and FIG. 10B. FIG. 10A shows an embodiment of a second charge pump of the present invention. FIG. 10B shows another embodiment of a second charge pump of the present invention. In one embodiment, the second charge pump 15 pumps the input voltage VIN according to the input voltage VIN and the output voltage VOUT to generate the power control signal VP1, so that the power control signal VP1 is higher than a level of the input voltage VIN. To be more specific, in one embodiment, the second charge pump 15 pumps the input voltage VIN to generate a voltage which is approximately a sum of the input voltage VIN plus the output voltage VOUT, to be the power control signal VP1 (as shown in FIG. 10A). In another embodiment, the second charge pump 15 pumps the input voltage VIN according to the input voltage VIN to generate the power control signal VP1, so that the power control signal VP1 is higher than a level of the input voltage VIN. To be more specific, in one embodiment, the second charge pump 15 pumps the input voltage VIN to generate a voltage which is approximately two-fold of the input voltage VIN, to be the power control signal VP1 (as shown in FIG. 10B).

Note that although it is preferred for the second charge pump 15 to pump the input voltage VIN to become approximately a sum of the input voltage VIN plus the output voltage VOUT or approximately two-fold of the input voltage VIN, however due to non-idealities caused by for example imperfection of components or imperfect matching among components, the pumped output voltage may not be exactly the sum of the input voltage VIN plus the output voltage VOUT or two-fold of the input voltage VIN, but just close to the above-mentioned desired values. In other words, according to the present invention, a certain level of error between the above-mentioned desired values and the pumped output voltage is acceptable, and therefore the term "approximately", wherever it is used, means that an insignificant error within a tolerable range is acceptable.

Figure 13A:
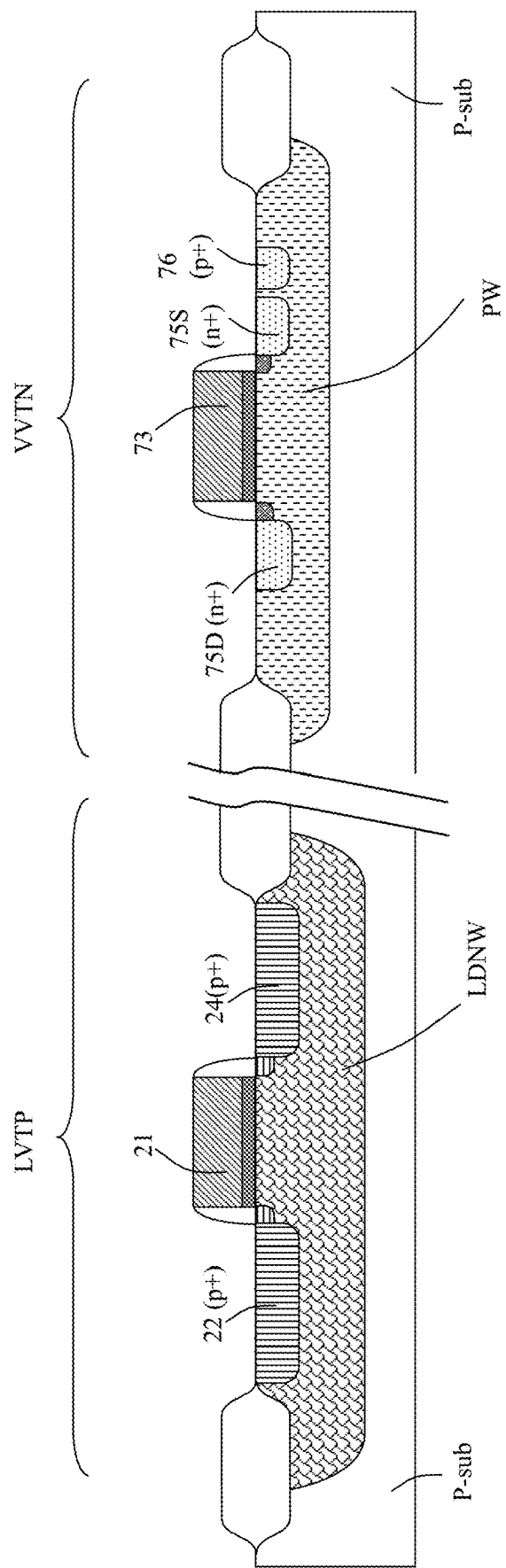
FIG. 13A shows a schematic cross-sectional diagram of an adjustable threshold voltage transistor having a second conductivity type according to an embodiment of the present invention.
Figure 13B:
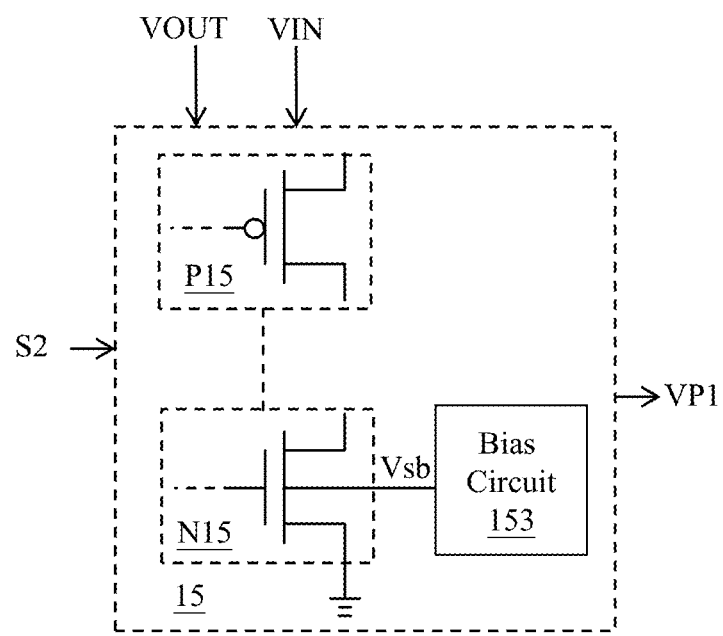
FIG. 13B shows an embodiment of a second charge pump of the present invention.
Figure 13C:
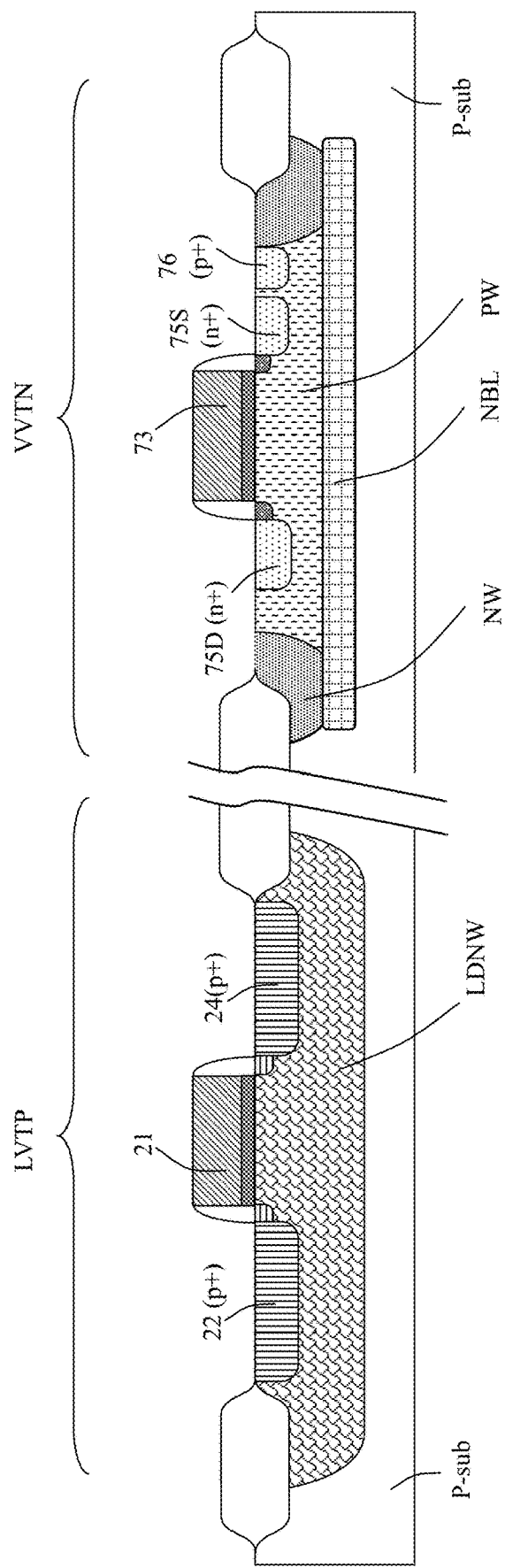
FIG. 13C shows a schematic cross-sectional diagram of an adjustable threshold voltage transistor having a second conductivity type according to another embodiment of the present invention.

On the other hand, under a situation where the input voltage VIN is high, there is a high likelihood that the low threshold voltage transistor will have a higher amount of leakage current. To overcome this drawback, it is preferred for certain transistors used in the switch control circuit 10 to be able to adaptively adjust their threshold voltages. Please refer to FIG. 13A to FIG. 13C. FIG. 13A shows a schematic cross-sectional diagram of an adjustable threshold voltage transistor having a second conductivity type according to an embodiment of the present invention. FIG. 13B shows an embodiment of a second charge pump of the present invention. FIG. 13C shows a schematic cross-sectional diagram of an adjustable threshold voltage transistor having a second conductivity type according to another embodiment of the present invention. In one embodiment, on the semiconductor substrate P-sub, there is further formed an adjustable threshold voltage transistor (i.e., an adjustable threshold voltage transistor VVTN as shown in FIG. 13A and FIG. 13C) having the second conductivity type. As shown in FIG. 13B, in one embodiment, the second charge pump 15 includes a first pumping switch P15 and a second pumping switch N15 which are coupled to each other, wherein the first pumping switch P15 and the second pumping switch N15 are configured to operably pump the input voltage VIN to generate the power control signal VP1. In one embodiment, the first pumping switch P15 includes a low threshold voltage transistor LVTP. In one embodiment, the second pumping switch N15 includes a low threshold voltage transistor LVTN. A body electrode of the second pumping switch N15 is biased (or adjusted) to a bias voltage signal Vsb, so as to adjust a threshold voltage of the second pumping switch N15. In one embodiment, the bias voltage signal Vsb can be adjusted to be higher than a source voltage of the second pumping switch N15, thereby lowering down the threshold voltage of the second pumping switch N15 so that the second pumping switch N15 can operate under the above-mentioned circumstance where the input voltage VIN is low.

As shown in FIG. 13A, in one embodiment, the adjustable threshold voltage transistor VVTN does not include a native NMOS transistor. In one embodiment, the adjustable threshold voltage transistor VVTN can be formed in a well PW having a first conductivity type. The well PW is formed in the semiconductor substrate P-sub. In one embodiment, the well PW is encompassed by a well NW having a second conductivity type and a deep well or a buried layer NBL having the second conductivity type (as shown in FIG. 13C), so that the well PW is not in contact with the semiconductor substrate P-sub. Certainly, in other embodiments, it is also practicable and within the scope of the present invention that the above-mentioned well NW and deep well or buried layer NBL can be omitted, so that the well PW is in direct contact with the semiconductor substrate P-sub (as shown in FIG. 13A). Or, in another embodiment, the semiconductor substrate can be an N-type semiconductor substrate; under such situation, it is also not required to encompass the well PW by the well NW and deep well or buried layer NBL. In one embodiment, under a situation where a body (i.e., the well PW) of the adjustable threshold voltage transistor VVTN is directly electrically connected to a source 75S of the adjustable threshold voltage transistor VVTN, the adjustable threshold voltage transistor VVTN corresponds to the above-mentioned general type threshold voltage transistor. As shown in FIG. 13A and FIG. 13C, in one embodiment, the bias voltage signal Vsb can be exerted or adjusted by providing a voltage signal to the body electrode 76 to control the voltage level of the well PW. In one embodiment, the bias voltage signal Vsb can be generated through a bias circuit 153.

When the power control signal VP1 turns OFF the power control switch P1, the first input voltage related signal VIN' and the second input voltage related signal VIN" will stop supplying power. As a consequence, no leakage current will occur in the circuits which are powered by the first input voltage related signal VIN' or the second input voltage related signal VIN".

Figure 14:
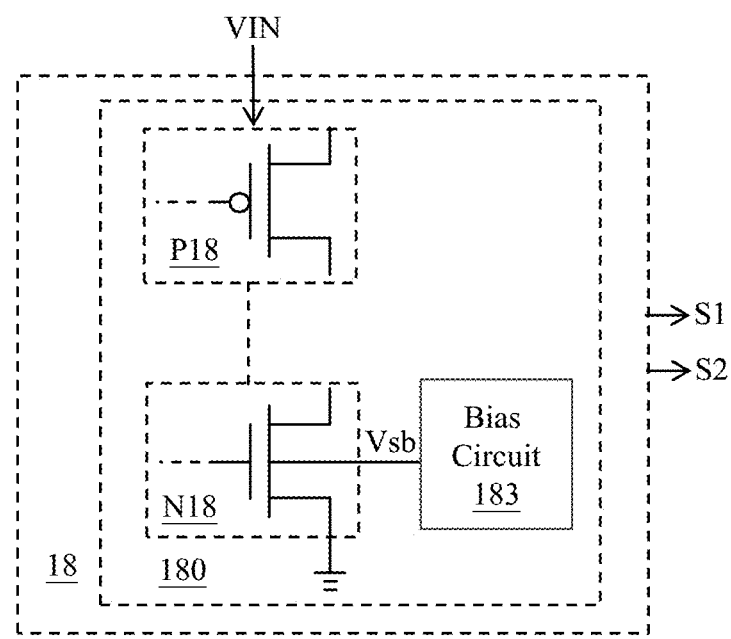
FIG. 14 shows an embodiment of an operation control circuit of the present invention.

Please refer to FIG. 4 along with FIG. 14. FIG. 14 shows an embodiment of an operation control circuit of the present invention. In one embodiment, the switching regulator of the present invention (for example, the switching regulator 100 shown in FIG. 4) can further include an operation control circuit 18. The operation control circuit 18 is powered by the input voltage VIN and is configured to operably generate operation signals S1 and S2. The operation signals S1 and S2 are configured to operably control an enabled mode, a disabled mode or an operation mode of at least one of the first oscillator 11, the first charge pump 12, the buffer circuit 16 and the second charge pump 15. The operation mode determines, for example, the level of the pumped voltage of the second charge pump 15 or ON/OFF of the power control switch P1 (for example by the operation signal S2). As shown in FIG. 4, in one embodiment, the operation control circuit 18 can include at least one logic circuit (for example the logic circuit 180 as shown in FIG. 14) which is powered by the input voltage VIN. The logic circuit 180 has at least one pull-up switch (for example, the pull-up switch P18 as shown in FIG. 14) and at least one pull-down switch (for example, the pull-down switch N18 as shown in FIG. 14). In one embodiment, the pull-up switch P18 includes a low threshold voltage transistor LVTP. In one embodiment, the pull-down switch N18 includes the adjustable threshold voltage transistor VVTN (i.e., the adjustable threshold voltage transistor VVTN as shown in FIG. 13A or FIG. 13C). A body electrode of the pull-down switch N18 is biased (or adjusted) to a bias voltage signal Vsb, so as to adjust the threshold voltage of the pull-down switch N18. In one embodiment, the bias voltage signal Vsb can be adjusted to be higher than the source voltage of the pull-down switch N18, thereby lowering down the threshold voltage of the pull-down switch N18. In one embodiment, the bias circuit 153 of the second charge pump 15 shown in FIG. 13B is also used as the bias circuit 183 of the logic circuit 180, that is, the bias circuit 183 is the bias circuit 153. In other words, the body electrode of the pull-down switch N18 can be biased through the bias voltage signal Vsb generated from the bias circuit 153. In one embodiment, the logic circuit 180 can include an independent bias circuit 183 (as shown in FIG. 14), that is, the bias circuit 183 is another circuit different from the bias circuit 153, to independently generate a bias voltage signal Vsb to bias the body electrode of the pull-down switch N18.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described herein before to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A switching regulator having a low start-up voltage, wherein the switching regulator having the low start-up voltage is configured to operably convert an input voltage to an output voltage, the switching regulator having the low start-up voltage comprising:
   a power stage; and
   a switch control circuit coupled to the power stage;
   wherein the power stage includes:
      an inductor; and
      at least one power switch coupled to the inductor;
   wherein the switch control circuit is configured to operably generate a power switch control signal according to the input voltage, to control the at least one power switch to control a coupling relationship of the inductor with the input voltage, the output voltage and a ground voltage level, thereby converting the input voltage to the output voltage; the switch control circuit including:
      a power control switch, which is configured to operably, according to a power control signal, electrically connect or disconnect an electrical connection path formed between the input voltage and a first input voltage related signal;
      a first oscillator coupled to the power control switch, the first oscillator being powered by the first input voltage related signal, the first oscillator being configured to operably generate a first clock signal;
      a first charge pump coupled to the first oscillator, the first charge pump being powered by the first input voltage related signal, wherein the first charge pump is configured to operably generate a second input voltage related signal according to the first clock signal, wherein a voltage level of the second input voltage related signal is higher than a voltage level of the first input voltage related signal;
      a second oscillator coupled to the first charge pump, the second oscillator being powered by the second input voltage related signal, wherein the second oscillator is configured to operably generate a second clock signal; and
      a driver circuit coupled between the second oscillator and the power switch, the driver circuit being powered by the second input voltage related signal, wherein the driver circuit is configured to operably generate the power switch control signal according to the second clock signal, to control an operation of the power switch, wherein the second clock signal determines a duty ratio of the power switch control signal;
   wherein the power control switch is a low threshold voltage transistor having a first conductivity type, which is formed in a semiconductor substrate;
   wherein the low threshold voltage transistor having the first conductivity type includes a first lightly doped region having a second conductivity type, which forms a channel region of the low threshold voltage transistor having the first conductivity type, and wherein the semiconductor substrate includes a second lightly doped region having the second conductivity type which is formed by a same manufacturing process as the first lightly doped region having the second conductivity type, wherein the second lightly doped region having the second conductivity type forms a drift region of a high-voltage transistor having the second conductivity type in the semiconductor substrate.

2. The switching regulator having the low start-up voltage of claim 1, wherein during a manufacturing process for forming the low threshold voltage transistor having the first conductivity type, a threshold voltage adjustment region having the first conductivity type for adjusting a threshold voltage of the low threshold voltage transistor having the first conductivity type is formed without defining a threshold voltage adjustment mask on the first lightly doped region having the second conductivity type.

3. The switching regulator having the low start-up voltage of claim 1, wherein an absolute value of a threshold voltage of the low threshold voltage transistor having the first conductivity type is lower than an absolute value of a threshold voltage of the power switch.

4. The switching regulator having the low start-up voltage of claim 1, wherein the semiconductor substrate includes a general type threshold voltage transistor; wherein an absolute value of a threshold voltage of the low threshold voltage transistor having the first conductivity type is lower than an absolute value of a threshold voltage of the general type threshold voltage transistor.

5. The switching regulator having the low start-up voltage of claim 1, wherein the switch control circuit further includes:
   a buffer circuit coupled between the first oscillator and the first charge pump, the buffer circuit being configured to operably generate the first clock signal according to a first initial clock signal generated from the first oscillator.

6. The switching regulator having the low start-up voltage of claim 1, wherein the semiconductor substrate further includes a low threshold voltage transistor having a second conductivity type, and wherein:
   (1) the first oscillator includes at least one low threshold voltage transistor having the first conductivity type;
   (2) the first oscillator includes at least one low threshold voltage transistor having the second conductivity type;
   (3) the buffer circuit includes at least one low threshold voltage transistor having the first conductivity type;
   (4) the buffer circuit includes at least one low threshold voltage transistor having the second conductivity type;
   (5) the first charge pump includes at least one low threshold voltage transistor having the first conductivity type;
   (6) the first charge pump includes at least one low threshold voltage transistor having the second conductivity type; or
   (7) a combination of two or more of the above-mentioned conditions (1) to (6);
   wherein the low threshold voltage transistor having the second conductivity type is formed in the semiconductor substrate, and wherein the semiconductor substrate forms a channel region of the low threshold voltage transistor having the second conductivity type.

7. The switching regulator having the low start-up voltage of claim 6, wherein during a manufacturing process for forming the low threshold voltage transistor having the second conductivity type, a threshold voltage adjustment region having the second conductivity type for adjusting a threshold voltage of the low threshold voltage transistor having the second conductivity type is formed without defining a second conductivity type threshold voltage adjustment mask on the semiconductor substrate.

8. The switching regulator having the low start-up voltage of claim 6, wherein the first oscillator includes: an odd number of NOT gates powered by the first input voltage related signal, to generate a first clock signal, wherein the odd number is equal to or greater than three; wherein the odd number of NOT gates form a ring oscillator; wherein each of the odd number of NOT gates includes a pull-up switch and a pull-down switch; wherein the pull-up switch is formed by the low threshold voltage transistor having the first conductivity type, whereas, the pull-down switch is formed by the low threshold voltage transistor having the second conductivity type.

9. The switching regulator having the low start-up voltage of claim 1, wherein the switch control circuit further includes:
  a second charge pump coupled to the power control switch, wherein the second charge pump is configured to operably pump the input voltage to generate the power control signal; wherein the power control signal turns OFF the power control switch by a voltage level exceeding a level of the input voltage, to avoid current leakage through the power control switch.

10. The switching regulator having the low start-up voltage of claim 9, wherein the second charge pump generates the power control signal by pumping the input voltage to approximately a sum of the input voltage plus the output voltage or approximately two-fold of the input voltage.

11. The switching regulator having the low start-up voltage of claim 9, wherein the semiconductor substrate further includes an adjustable threshold voltage transistor having the second conductivity type; wherein the second charge pump includes:
  a first pumping switch; and
  a second pumping switch coupled to the first pumping switch;
  wherein the first pumping switch and the second pumping switch are configured to operably pump the input voltage to generate the power control signal, wherein the first pumping switch is formed by the low threshold voltage transistor having the first conductivity type, whereas, the second pumping switch is formed by the adjustable threshold voltage transistor having the second conductivity type; wherein a body electrode of the second pumping switch is adjusted to a bias voltage signal, so as to adjust a threshold voltage of the second pumping switch.

12. The switching regulator having the low start-up voltage of claim 11, wherein the switch control circuit further includes:
  an operation control circuit which is powered by the input voltage, the operation control circuit being configured to operably control an enabled mode, a disabled mode or an operation mode of at least one of the first oscillator, the first charge pump, the buffer circuit and the second charge pump;
  wherein operation control circuit includes:
    at least one logic circuit which is powered by the input voltage, the at least one logic circuit having at least one pull-up switch and at least one pull-down switch; wherein the pull-up switch is formed by the low threshold voltage transistor having the first conductivity type, whereas, the pull-down switch is formed by the adjustable threshold voltage transistor having the second conductivity type;
    wherein a body electrode of the at least one pull-down switch is adjusted to the bias voltage signal, so as to lower down a threshold voltage of the at least one pull-down switch.

13. The switching regulator having the low start-up voltage of claim 1, wherein the switch control circuit further includes:
  a level shifting switch, which is connected in series between the power control switch and the first input voltage related signal, wherein the level shifting switch is formed by the low threshold voltage transistor having the first conductivity type;
  wherein the level shifting switch is configured to operably clamp a drain voltage of the power control switch, so that a drain-gate voltage of the power control switch is not greater than a voltage limit, thereby improving reliability of the power control switch.

14. The switching regulator having the low start-up voltage of claim 1, wherein the first conductivity type is P-type, while the second conductivity type is N-type.

15. The switching regulator having the low start-up voltage of claim 14, wherein the low threshold voltage transistor having the second conductivity type is a native NMOS transistor.

16. The switching regulator having the low start-up voltage of claim 1, wherein the switching regulator having the low start-up voltage is a boost switching regulator, wherein the inductor has one end coupled to the input voltage, and wherein the power switch is configured to operably switch another end of the inductor between the output voltage and the ground voltage level.

17. A switch control circuit configured to operably control a switching regulator having a low start-up voltage, for converting an input voltage to an output voltage, wherein the switching regulator having the low start-up voltage includes: a power stage; and a switch control circuit coupled to the power stage; wherein the power stage includes: an inductor; and at least one power switch coupled to the inductor; wherein the switch control circuit is configured to operably generate a power switch control signal according to the input voltage, to control the at least one power switch to control a coupling relationship of the inductor with the input voltage, the output voltage and a ground voltage level, thereby converting the input voltage to the output voltage; the switch control circuit comprising:
  a power control switch, which is configured to operably, according to a power control signal, electrically connect or disconnect an electrical connection path formed between the input voltage and a first input voltage related signal;
  a first oscillator coupled to the power control switch, the first oscillator being powered by the first input voltage related signal, the first oscillator being configured to operably generate a first clock signal;
  a first charge pump coupled to the first oscillator, the first charge pump being powered by the first input voltage related signal, wherein the first charge pump is configured to operably generate a second input voltage related signal according to the first clock signal, wherein a voltage level of the second input voltage related signal is higher than a voltage level of the first input voltage related signal;
  a second oscillator coupled to the first charge pump, the second oscillator being powered by the second input voltage related signal, wherein the second oscillator is configured to operably generate a second clock signal; and
  a driver circuit coupled between the second oscillator and the power switch, the driver circuit being powered by the second input voltage related signal, wherein the driver circuit is configured to operably generate the power switch control signal according to the second clock signal, to control an operation of the power switch, wherein the second clock signal determines a duty ratio of the power switch control signal;

wherein the power control switch is a low threshold voltage transistor having a first conductivity type, which is formed in a semiconductor substrate;

wherein the low threshold voltage transistor having the first conductivity type includes a first lightly doped region having a second conductivity type, which forms a channel region of the low threshold voltage transistor having the first conductivity type, and wherein the semiconductor substrate includes a second lightly doped region having the second conductivity type which is formed by a same manufacturing process as the first lightly doped region having the second conductivity type, wherein the second lightly doped region having the second conductivity type forms a drift region of a high-voltage transistor having the second conductivity type in the semiconductor substrate.

18. The switch control circuit of claim 17, wherein during a manufacturing process for forming the low threshold voltage transistor having the first conductivity type, a threshold voltage adjustment region having the first conductivity type for adjusting a threshold voltage of the low threshold voltage transistor having the first conductivity type is formed without defining a threshold voltage adjustment mask on the first lightly doped region having the second conductivity type.

19. The switch control circuit of claim 17, wherein an absolute value of a threshold voltage of the low threshold voltage transistor having the first conductivity type is lower than an absolute value of a threshold voltage of the power switch.

20. The switch control circuit of claim 17, wherein the semiconductor substrate includes a general type threshold voltage transistor; wherein an absolute value of a threshold voltage of the low threshold voltage transistor having the first conductivity type is lower than an absolute value of a threshold voltage of the general type threshold voltage transistor.

21. The switch control circuit of claim 17, further comprising:
a buffer circuit coupled between the first oscillator and the first charge pump, the buffer circuit being configured to operably generate the first clock signal according to a first initial clock signal generated from the first oscillator.

22. The switch control circuit of claim 17, characterized in that: wherein the semiconductor substrate further includes a low threshold voltage transistor having a second conductivity type, and wherein:

(1) the first oscillator includes at least one low threshold voltage transistor having the first conductivity type;

(2) the first oscillator includes at least one low threshold voltage transistor having the second conductivity type;

(3) the buffer circuit includes at least one low threshold voltage transistor having the first conductivity type;

(4) the buffer circuit includes at least one low threshold voltage transistor having the second conductivity type;

(5) the first charge pump includes at least one low threshold voltage transistor having the first conductivity type;

(6) the first charge pump includes at least one low threshold voltage transistor having the second conductivity type; or (7) a combination of two or more of the above-mentioned conditions (1) to (6);

wherein the low threshold voltage transistor having the second conductivity type is formed in the semiconductor substrate, and wherein the semiconductor substrate forms a channel region of the low threshold voltage transistor having the second conductivity type.

23. The switch control circuit of claim 22, wherein during a manufacturing process for forming the low threshold voltage transistor having the second conductivity type, a threshold voltage adjustment region having the second conductivity type for adjusting a threshold voltage of the low threshold voltage transistor having the second conductivity type is formed without defining a second conductivity type threshold voltage adjustment mask on the semiconductor substrate.

24. The switch control circuit of claim 22, wherein the first oscillator includes: an odd number of NOT gates powered by the first input voltage related signal, to generate a first clock signal, wherein the odd number is equal to or greater than three; wherein the odd number of NOT gates form a ring oscillator; wherein each of the odd number of NOT gates includes a pull-up switch and a pull-down switch; wherein the pull-up switch is formed by the low threshold voltage transistor having the first conductivity type, whereas, the pull-down switch is formed by the low threshold voltage transistor having the second conductivity type.

25. The switch control circuit of claim 17, further comprising:
a second charge pump coupled to the power control switch, wherein the second charge pump is configured to operably pump the input voltage to generate the power control signal; wherein the power control signal turns OFF the power control switch by a voltage level exceeding a level of the input voltage, to avoid current leakage through the power control switch.

26. The switch control circuit of claim 25, wherein the second charge pump generates the power control signal by pumping the input voltage to approximately a sum of the input voltage plus the output voltage or approximately two-fold of the input voltage.

27. The switch control circuit of claim 25, wherein the semiconductor substrate further includes an adjustable threshold voltage transistor having the second conductivity type; wherein the second charge pump includes:
a first pumping switch; and
a second pumping switch coupled to the first pumping switch;
wherein the first pumping switch and the second pumping switch are configured to operably pump the input voltage to generate the power control signal, wherein the first pumping switch is formed by the low threshold voltage transistor having the first conductivity type, whereas, the second pumping switch is formed by the adjustable threshold voltage transistor having the second conductivity type; wherein a body electrode of the second pumping switch is adjusted to a bias voltage signal, so as to adjust a threshold voltage of the second pumping switch.

28. The switch control circuit of claim 27, further comprising:
- an operation control circuit which is powered by the input voltage, the operation control circuit being configured to operably control an enabled mode, a disabled mode or an operation mode of at least one of the first oscillator, the first charge pump, the buffer circuit and the second charge pump;
- wherein operation control circuit includes:
    - at least one logic circuit which is powered by the input voltage, the at least one logic circuit having at least one pull-up switch and at least one pull-down switch; wherein the pull-up switch is formed by the low threshold voltage transistor having the first conductivity type, whereas, the pull-down switch is formed by the adjustable threshold voltage transistor having the second conductivity type;
    - wherein a body electrode of the at least one pull-down switch is adjusted to the bias voltage signal, so as to lower down a threshold voltage of the at least one pull-down switch.

29. The switch control circuit of claim 17, further comprising:
- a level shifting switch, which is connected in series between the power control switch and the first input voltage related signal, wherein the level shifting switch is formed by the low threshold voltage transistor having the first conductivity type;
- wherein the level shifting switch is configured to operably clamp a drain voltage of the power control switch, so that a drain-gate voltage of the power control switch is not greater than a voltage limit, thereby improving reliability of the power control switch.

30. The switch control circuit of claim 17, wherein the first conductivity type is P-type, while the second conductivity type is N-type.

31. The switch control circuit of claim 30, wherein the low threshold voltage transistor having the second conductivity type is a native NMOS transistor.

* * * * *